US011881255B2

(12) United States Patent
Lee et al.

(10) Patent No.: US 11,881,255 B2
(45) Date of Patent: Jan. 23, 2024

(54) LOOK AHEAD SWITCHING CIRCUIT FOR A MULTI-RANK SYSTEM

(71) Applicant: NVIDIA Corp., Santa Clara, CA (US)

(72) Inventors: Jiwang Lee, San Jose, CA (US); Jaewon Lee, Santa Clara, CA (US); Hsuche Nee, Zhubei (TW); Po-Chien Chiang, Hsinchu (TW); Wen-Hung Lo, Saratoga, CA (US); Abhishek Dhir, Mississauga (CA); Michael Ivan Halfen, San Francisco, CA (US); Chunjen Su, Zhubei (TW)

(73) Assignee: NVIDIA CORP., Santa Clara, CA (US)

( * ) Notice: Subject to any disclaimer, the term of this patent is extended or adjusted under 35 U.S.C. 154(b) by 152 days.

(21) Appl. No.: 17/730,379

(22) Filed: Apr. 27, 2022

(65) Prior Publication Data
US 2023/0352081 A1    Nov. 2, 2023

(51) Int. Cl.
*G11C 11/40* (2006.01)
*G11C 11/4093* (2006.01)
*H03K 17/687* (2006.01)

(52) U.S. Cl.
CPC ...... *G11C 11/4093* (2013.01); *H03K 17/6874* (2013.01)

(58) Field of Classification Search
CPC ..... G11C 11/4093; G11C 7/10; G11C 7/1003; G11C 7/1012; G11C 7/1048
See application file for complete search history.

(56) References Cited

U.S. PATENT DOCUMENTS

| | | | |
|---|---|---|---|
| 6,177,816 B1 | 1/2001 | Nagata | |
| 10,205,431 B2 | 2/2019 | Kang et al. | |
| 2004/0054845 A1 | 3/2004 | Ware et al. | |
| 2006/0255990 A1 | 11/2006 | Keeth | |
| 2014/0002131 A1 | 1/2014 | Shaeffer | |
| 2014/0269130 A1* | 9/2014 | Maeng | G11C 7/1084 365/207 |
| 2020/0201781 A1* | 6/2020 | Jain | G06F 3/0659 |

* cited by examiner

*Primary Examiner* — Han Yang
(74) *Attorney, Agent, or Firm* — Rowan TELS LLC

(57) ABSTRACT

A multi-rank circuit system utilizing a shared IO channel includes a first stage of multiple selectors coupled to input multiple digital busses, and a second stage including one or more selectors coupled to receive outputs of the first stage of selectors and to individually select one of the outputs of the first stage of selectors to one or more control circuits for IO circuits of the ranks. The system switches one of the ranks to be an active rank on the shared IO channel, and operates the first stage of selectors to select one of the digital busses to the second stage of selectors in advance of switching a next active rank to the shared IO channel.

21 Claims, 26 Drawing Sheets

LOOK AHEAD SWITCHING CIRCUIT FOR A MULTI-RANK SYSTEM

BACKGROUND

Certain circuits, such as double data rate (DDR) and low-power double data rate (LPDDR) memory circuits utilize pseudo-differential signaling interfaces. These interfaces utilize reference voltages (VREFs) to distinguish logical 0 or 1 inbound binary signals on particular input or output (IO) terminals (e.g., package pins).

As interface speeds increase, channel margin decreases. Ideally, each IO terminal receiver may be adjusted with an optimum VREF to account for process variations particular to the receiver for that terminal. Conventionally, this has meant utilizing multiple VREF generators, for example one for each individual IO terminal. In multi-rank system the problem is exacerbated because each rank operates on its own VREF. For example a memory interface with nine data pins and four ranks per pin conventionally requires a total of 36 VREF generators. Implementing this many reference voltage generators takes up a substantial amount of circuit area.

In addition to consuming a large amount of circuit area, the conventional approach to VREF generation also complicates circuit layout and routing. A pin-specific VREF generator should be located near to the pin it services. The vicinity of the pin (or pad, in the case of an internal terminal) is often crowded with critical circuits such as transmitters and receivers. Co-locating a VREF generator in this region of the design may present a burden on layout design. Furthermore, because each per-pin VREF is generated independently of the others, separate control signals are needed. For example, if the value of VREF is configured using a 7-bit code applied to the reference voltage generator, then a nine-pin, four rank system requires 36 VREF*7-bits=252 control signals. In such circumstances it may become impractical to co-locate per-pin VREF generators near to their respective pins (or pads), and the VREF signals must be routed across significant distances to reach each pin. This consumes and complicates the metal routing channel(s) for the larger circuit system.

In multi-rank circuit systems, multiple data transmitting circuits are coupled (ganged) to a single input/output (IO) channel. A matching number of receivers for inbound transmissions are ganged on the other end of the communication channel. This arrangement enables fast rank-to-rank switching. Some communication channels, such as those used with multi-rank dynamic random access memories (DRAMs), utilize pseudo-differential signaling based on a reference voltage (vref). This reference voltage is "trained" (tested and configured) individually for each rank. When the system switches ranks on the IO channel, the reference voltage is also changed. However in this approach, the reference voltage, being analog, may not settle to a different level fast enough to enable fast rank switching.

Conventional systems address this limitation by providing multiple receivers (as many as there are ranks), each receiving and operating from a customized, preconfigured vref value for a corresponding rank. When the ranks are switched, there is no need to switch reference voltages, because the preconfigured reference voltage for the rank that is switched to is already present at the corresponding receiver. However, as the number of ranks increases, the area and power costs for this approach becomes prohibitive, especially in high-density circuits.

FIG. 1A depicts an exemplary circuit system utilizing a single global reference voltage source. One global reference voltage generator 102 provides the reference voltage for each of a plurality of pseudo-differential signal receivers 104, 106, 108. In this example each of the receivers 104, 106, 108 operates to receive bits from a different one of x serial data lines (DQx). The global reference voltage generator 102 is operated with an ENABLE signal (to turn its output VREF signal on or off) and an n-bit CONTROL signal that sets an analog level of VREF with a resolution of $$\frac{VREF_{max} - VREF_{min}}{2^n}$$

step size, where $VREF_{max}$ and $VREF_{min}$ are the maximum and minimum voltages that the global reference voltage generator 102 may output.

FIG. 1B depicts an exemplary circuit system utilizing a plurality of reference voltage generators. Each receiver is configured with a reference voltage that may be tuned to the characteristics of the particular receiver. Thus, receiver 104 receives a reference voltage $VREF_0$ from local reference voltage generator 116, receiver 106 receives a reference voltage $VREF_1$ from local reference voltage generator 118, and so on for x receivers, up to receiver 108 that receives $VREF_{x-1}$ from local reference voltage generator 120. To achieve the same resolution as the embodiment in FIG. 1A, the output value of each of the local reference voltage generators is configurable with an n-bit control code.

FIG. 1C depicts a multi-rank circuit system utilizing a plurality of reference voltage generators. Herein, the term "rank" refers to a set of integrated circuit chips operable from the same chip select signal, which therefore may be operated simultaneously. In the particular case of memory chips, rank refers to a number of memory chips that may be accessed (e.g., read or written) simultaneously.

For example, on n a DDR, DDR2, or DDR3 memory module, each rank may comprise a 64-bit-wide data bus (72 bits wide on memories that support 8-bit error correcting codes—ECC). The number of physical DRAMs in a rank depends on the individual bit-widths of the chips. For example, a rank of ×8 (8-bit wide) DRAMs may comprise eight physical chips (or nine if ECC is supported), but a rank of ×4 (4-bit wide) DRAMs may comprise 16 physical chips (or 18, if ECC is supported). Multiple ranks may coexist on a single memory module. For example a memory module may comprise one rank (single rank), two ranks (dual rank), four ranks (quad rank), or eight ranks (octal rank). Although multi-rank examples herein may be presented in the context of machine memories, the disclosed mechanisms are no limited to use with memory chips or circuits.

In a multi-rank system, the number of reference voltage generators and control lines utilized may increase substantially due to each pin/pad of each rank having a corresponding IO circuit that operates on its own individual reference voltage. For example in FIG. 1C, each of a number x of DQ (memory data) lines for each of a number y of ranks utilizes its own reference voltage generator, resulting in x*y reference voltage generators and x*y*n control signal lines. Receiver 104 for $DQ_0$, rank 0 receives a reference voltage from local reference voltage generator 122; receiver 106 for $DQ_0$, rank 1 receives a reference voltage from local reference voltage generator 124; and so on, up to receiver 108 for DQ$_0$, rank y−1, which receives a reference voltage from local reference voltage generator 126. This pattern repeats for x DQ lines.

FIG. 1D depicts an example global reference voltage generator. The design of a local reference voltage generator may be similar. A multiplexer 110 receives inputs from multiple ($2^n$) taps on a voltage ladder 112. An n-bit control signal selects one of the multiplexer 110 inputs to its output, where the selected voltage emerges from a unity gain buffer 114 as VREF.

FIG. 2 depicts an example of a multi-rank (dual-rank) DRAM system, comprising a DRAM 202 and a DRAM 204 (each 8-bits and one ECC bit wide) that send and receive signals via various receivers 206, 208, 210, and 212 in a physical communication layer circuit 214 chip. A rank-select (e.g., chip-select) signal activates one of the DRAM chips and corresponding receivers (or transmitters) in the physical communication layer circuit 214 at a time to communicate data over DQ$_0$-DQ$_8$.

FIG. 6 depicts a multi-rank circuit system comprising a plurality of ranks 602 (e.g., memory chips or memory banks) that each include a transmitter 604. The transmitters 604 are ganged onto a single IO channel 606 to a PHY circuit 608 (physical layer communication circuit) comprising a plurality of receivers 610. During operation when a rank is switched, one of the transmitters 604 is enabled to communicate over the IO channel 606 to one of the receivers 610 that is "tuned" with a reference voltage for the transmitter it communicates with. The other receivers 610 are disabled until the ranks are again switched. Due to PVT (process, temperature, and voltage) variations among the various circuits, each receiver 610 is provided with a reference voltage independent of the others. This enables a particular receiver 610 to accurately distinguish data signals at high frequency communication speeds from a particular transmitter 604 over the IO channel 606.

A multi-rank circuit system is depicted in FIG. 11. The system comprises a plurality of rank circuits 1102 coupled to a plurality of input/output circuits (IO circuits 1104). Each IO circuit 1104 is paired with its own control circuit 1106. The rank circuits 1102 and IO circuits 1104 are "ganged" on a shared IO channel 1108, and one rank circuit 1102 is switched to communicate with one IO circuit 1104 at a time. Pairing each IO circuit 1104 with its own control circuit 1106 is inefficient both in terms of area and power consumption.

FIG. 20 depicts examples of signal eyes for a first rank (rank 0) and a second rank (rank 1) of a multi-rank circuit system. Due to process (manufacturing) and/or operational (e.g., temperature and voltage) variations between the two ranks, the signal eyes are different. Specifically, the operative reference voltage range varies between the ranks. Therefore the optimum operating point, at the center of each signal eye, is different for the different ranks.

FIG. 21A depicts an example of a 2-rank circuit system. The system comprises a data receiver 2108 configured with a reference voltage provided by reference voltage generator 2102, and further configured with a timing adjustment from a clock timing adjuster 2106. The resulting detected data signals from the selected one of the ranks communicating on the data (DQ) line are provided to a deserializer 2110 and further distributed/processed from that point. FIG. 21B depicts an example signal eye for rank 0 access utilizing an average reference voltage for all ranks. The average reference voltage is utilized due to the long settling time of the reference voltage generator, relative to the rank switching time. Due to the reference voltage being an average and less than optimal for rank 0, it is not possible to access rank 0 in the widest portion of the signal eye. FIG. 21C depicts an example signal eye for rank 1 access utilizing an average reference voltage for all ranks. The average reference voltage is utilized due to the long settling time of the reference voltage generator, relative to the rank switching time. Due to the reference voltage being an average and larger than optimal for rank 1, it is not possible to access rank 1 in the widest portion of the signal eye.

In some multi-rank systems (e.g., DRAM interfaces utilizing single-ended signaling) the data receivers may further utilize clock timing adjustment circuitry to detect the data communicated over the common data link from each rank. Optimizing both of the reference voltage and clock timing for each rank may enable a superior voltage and timing margin for detecting the received data (e.g., detection is more centered in the signaling eye). Conventional multi-rank systems use an average of the optimum reference voltages for the multiple ranks and a common clock timing adjustment circuit for the ranks. As a result, the optimum timing margins and rank switching speeds cannot be achieved.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1B:
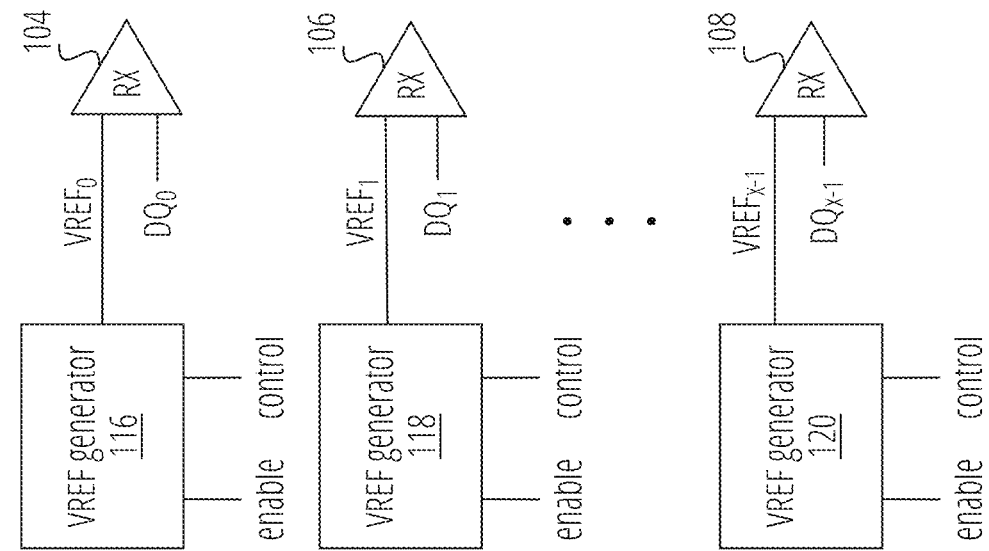
FIG. 1B depicts a circuit system utilizing a plurality of reference voltage generators.
Figure 1A:
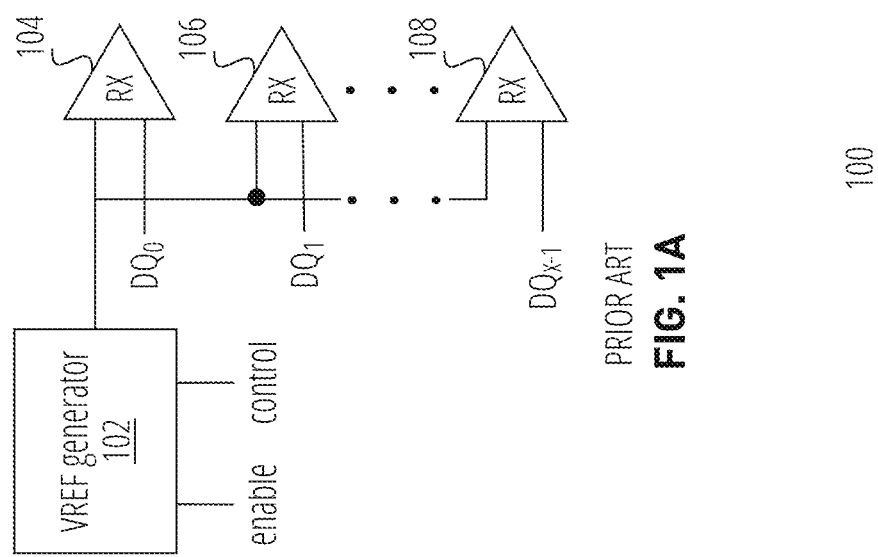
FIG. 1A depicts a circuit system utilizing a single global reference voltage source.
Figure 1D:
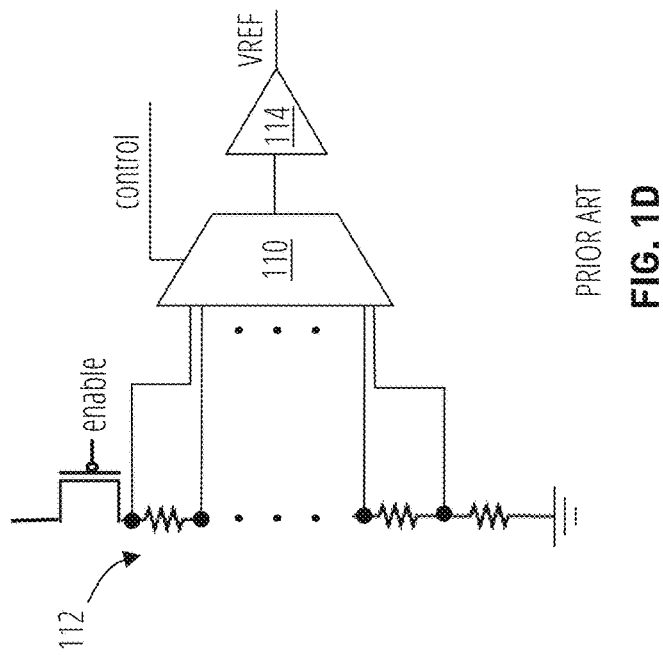
FIG. 1D depicts an implementation of a conventional reference voltage generator.
Figure 1C:
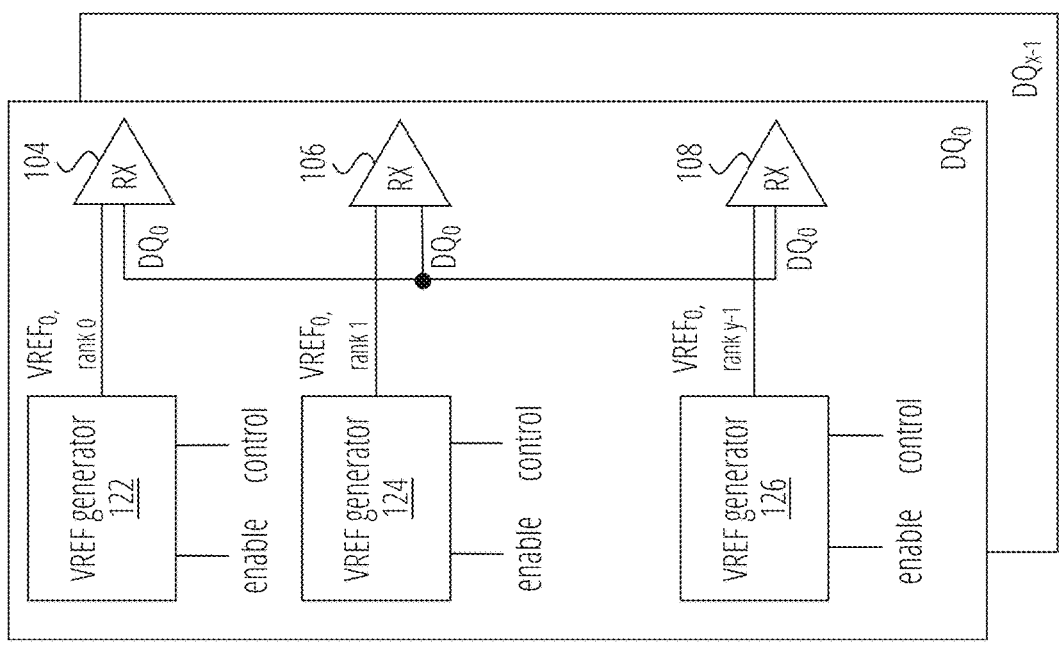
FIG. 1C depicts a multi-rank circuit system utilizing a plurality of reference voltage generators.
Figure 2:
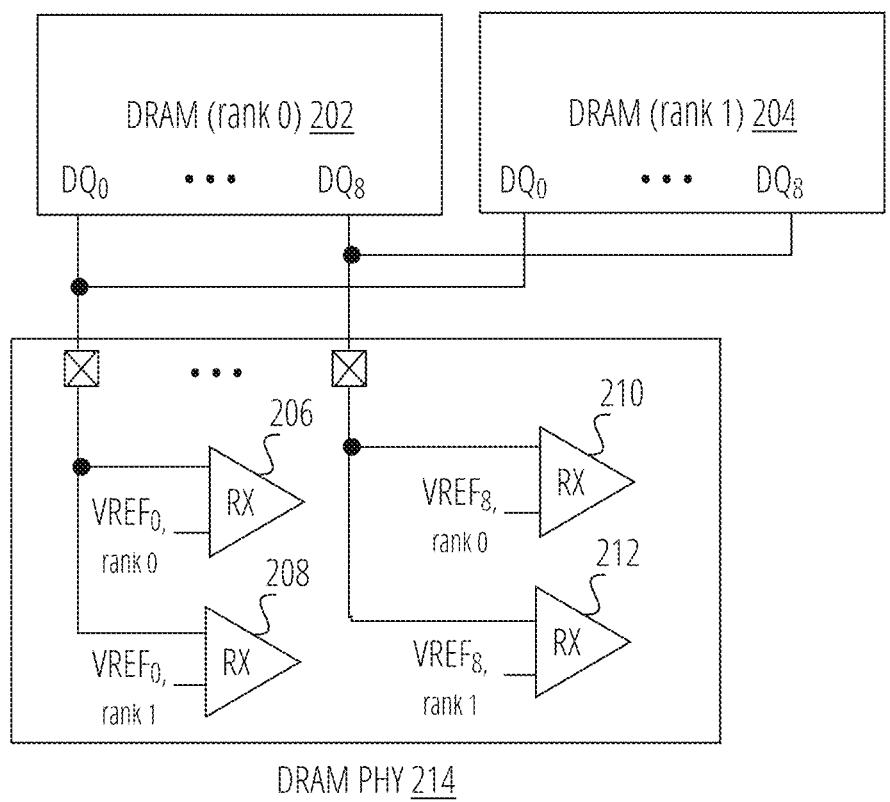
FIG. 2 illustrates an aspect of the subject matter in accordance with one embodiment.

A global reference voltage generator may be located in a circuit at less critical location than near the pins or pads. The global reference voltage generator generates a range of voltages, meaning a lower and an upper bound for a reference voltage used locally near the pin or pad. Simplified local reference voltage generators that consume a lower amount of circuit area than conventional reference voltage generators receive the upper and lower voltages from the global reference voltage generator and transform them into reference voltages applied locally near the pin or pad.

By this mechanism, circuit area consumption is reduced at critical locations near the pin or pad, and routing channels are made less congested. The global reference voltage generator, which may be relatively (compared to the local reference voltage generators) large in size, is located in a less critical area of the layout. Two voltage levels area distributed to each local reference voltage generator, reducing analog voltage routing that typically requires wider widths, spacing, and shielding. The number of control signals to configure the pin- or pad-specific VREFs may also be reduced.

Consider again the example of nine DQ (data pins) and four ranks per data pin with VREF controlled by a 7-bit code. Utilizing the conventional approach, the number of analog voltage routings is 9 pins*4 ranks per pin=36 VREF control signals*7-bits per VREF generator=252 routings. Using the disclosed mechanisms, the number of analog voltage routings is reduced to just two (2), the upper/lower global reference voltage generator output signals. Assuming fewer configuration bits needed for each local reference voltage generator (e.g., 4-bits per VREF) and 36 local reference voltage generators yields a reduction to 144 control signals needed.

The disclosed mechanisms may also enable greater flexibility of reference voltage granularity. In the conventional solutions, once the control signal bus width (number of control bits) for the single reference voltage generator is set, the step size for setting VREF is also fixed. In other words, the VREF granularity is a function of the reference voltage generator control signal bus width. Using the disclosed mechanisms, the step size of VREF is a function of the global VREF generator output range, which is programmable.

A unified receiver (replacing multiple distinct receiver circuits) may include one or more digitally controlled branches. Although it utilized a preconfigured analog reference voltage, the unified receiver does not switch analog references voltages when ranks are switched. Instead, it implements digital control of a transistor strength in one or more parallel sub-branches of the receiver to fine-tune the differential output. Embodiments of the unified receiver may enable faster rank switching and may consume less circuit area than conventional approaches while maintaining the benefit of an analog reference voltage that reflects process, temperature, and voltage variations in the power supply and the system overall.

The input/output (IO) circuits for a multi-rank system may be "trained" with settings (delay, voltage, current etc.) that compensate for the process, voltage, and/or temperature variations across ranks. These settings may be stored in a controller. When the controller switches ranks, the training information is adjusted accordingly.

To address the limitations of conventional multi-rank systems, the multiple ranks may be arranged to communicate over a common data line (e.g., a single-ended serial data line) to multiple data receivers, each corresponding to one or more of the ranks. Multiple reference voltage generators, each corresponding to one or more of the data receivers, and multiple clock timing adjustment circuits, each corresponding to one or more of the data receivers, may be applied to configure the data receivers. By way of this arrangement a rank to communicate on the shared data line may be switched without reconfiguring outputs of either the reference voltage generators or the clock timing adjustment circuits, and the communication may be carried out closer to the optimum center of the signaling eye for the rank selected to communicate on the data line.

Embodiments of a dual-step mechanism for training/configuring reference voltages in a multi-rank circuit are described. The mechanisms may reduce cost (e.g., silicon area and training time in some cases) over conventional approaches, and lead to greater timing margin for the ranks. A range for second-step training is determined in the first step, enabling the second step to proceed with finer resolution over a limited, predetermined range. This is potentially faster and reduces hardware complexity over prior approaches.

Other technical features may be readily apparent to one skilled in the art from the following figures, descriptions, and claims.

Figure 3A:
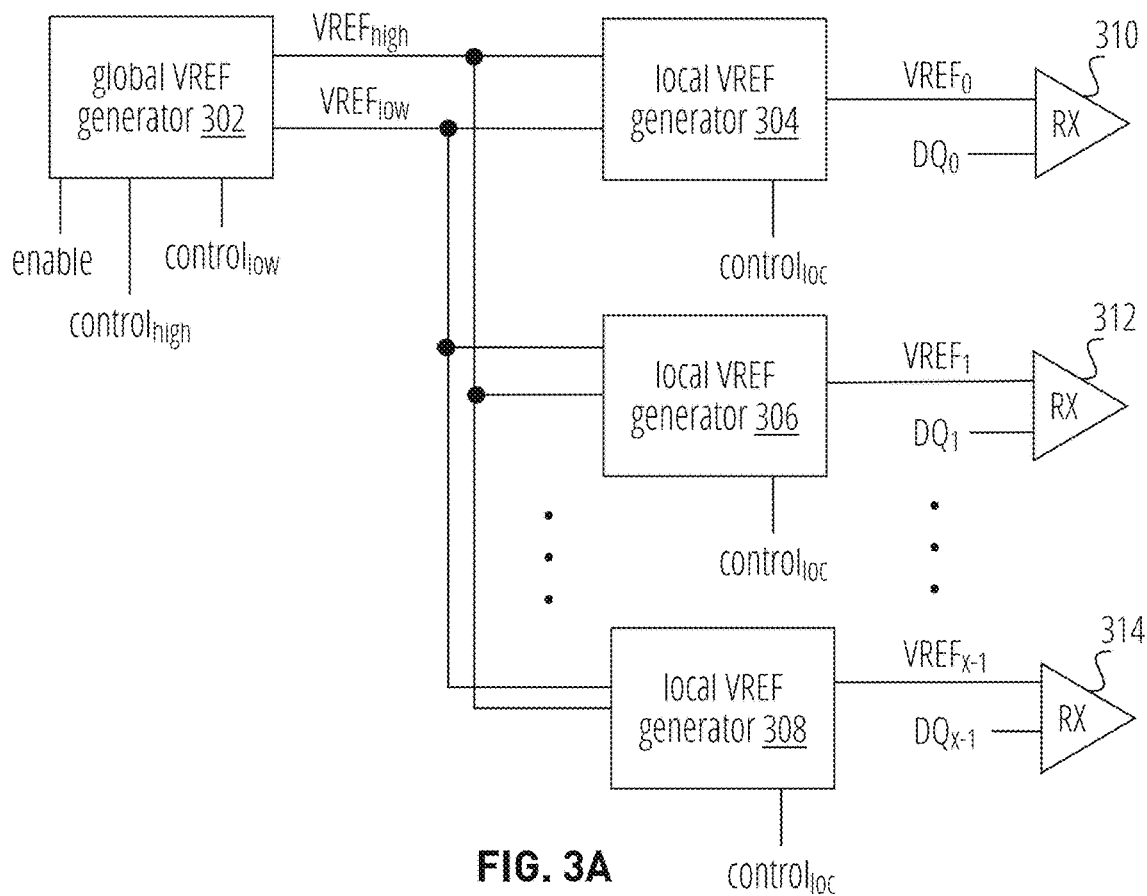
FIG. 3A depicts an embodiment of a system utilizing a combination of a global reference voltage generator and a plurality of local reference voltage generators.

FIG. 3A depicts an embodiment of a system utilizing a combination of a global reference voltage generator 302 and a plurality of local reference voltage generators 304, 306 . . . 308 for receivers 310, 312, . . . 314, respectively. The global reference voltage generator 302 generates two output reference voltages, $VREF_{high}$ and $VREF_{low}$. Each of these voltages may be configured separately with n-bit control signals $control_{high}$ and $control_{low}$, respectively. Because both of $VREF_{high}$ and $VREF_{low}$ are separately configurable, the range $VREF_{high}$-$VREF_{low}$ is configurable in upper value, lower value, and extent, with a resolution of $$\frac{VREF_{max} - VREF_{min}}{2^n}.$$

Figure 3B:
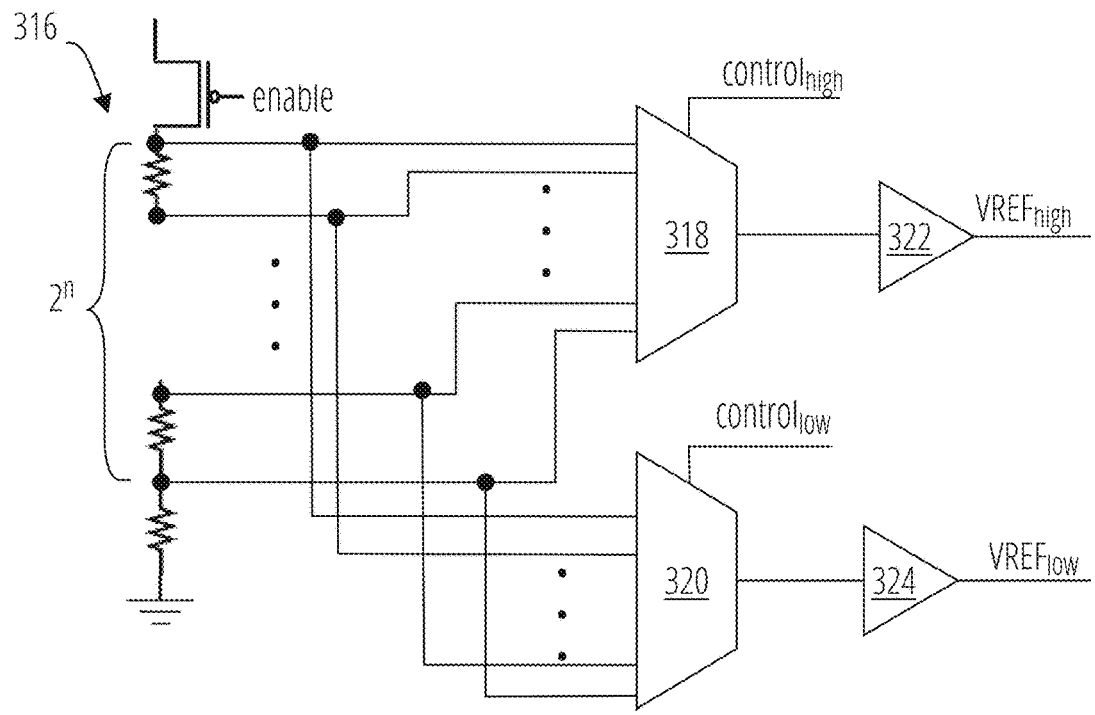
FIG. 3B depicts a global reference voltage generator in accordance with one embodiment.

One embodiment of a global reference voltage generator 302 is depicted in FIG. 3B. A voltage ladder 316 comprising $2^n$ taps supplies inputs to a first multiplexer 318 for selection of $VREF_{high}$, and a second multiplexer 320 for selection of $VREF_{low}$. Unity gain buffers 322, 324 are utilized for high-impedance output.

Figure 3C:
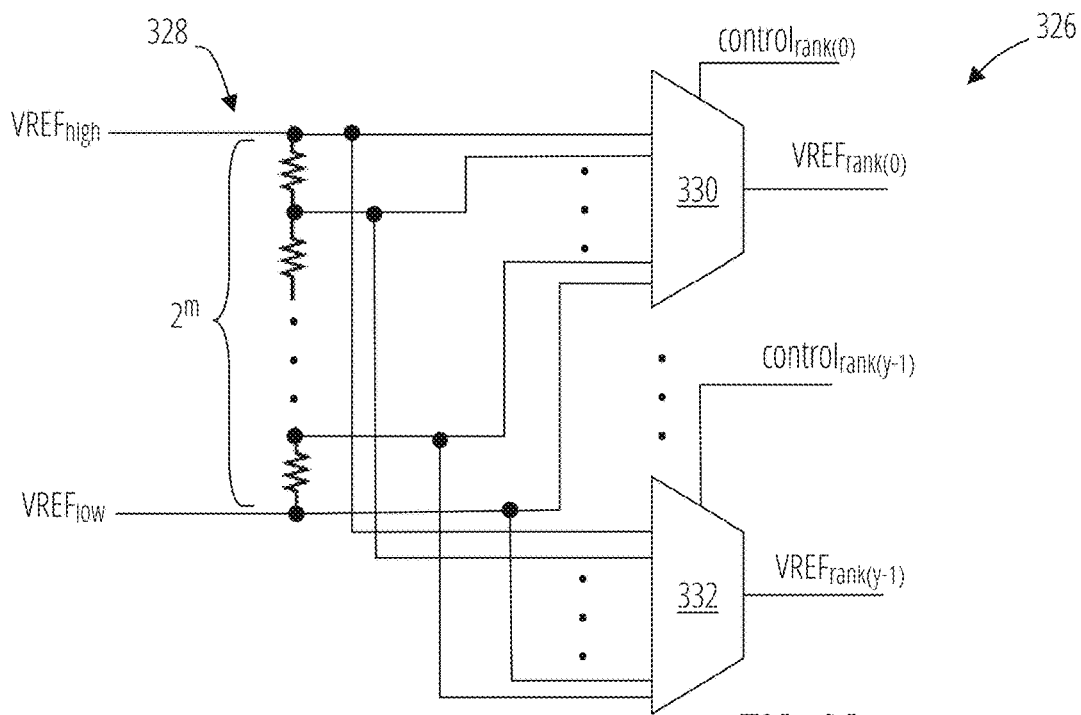
FIG. 3C depicts a local reference voltage generator in accordance with one embodiment.

One embodiment of a rank reference voltage generator 326 for a rank of IO devices is depicted in FIG. 3C. A voltage ladder 328 comprises $2^m$ taps provided toy multiplexers, one per rank of the system being supplied. An m-bit control value provided to each of the multiplexers 330 . . . 332 enables individualized selection of VREF per rank, with a resolution of $$\frac{VREF_{high} - VREF_{low}}{2^m}.$$

Not only may each IO device receive an individualized and localized VREF, but the value of the local VREFs may thus be set with higher resolution than if a global reference voltage generator alone were utilized (e.g., utilizing a narrow range for $VREF_{high}$-$VREF_{low}$ and dividing it into $2^m$ steps). Also, utilizing a single local voltage ladder 328 shared among many multiplexers may significantly reduce circuit area.

Figure 3D:
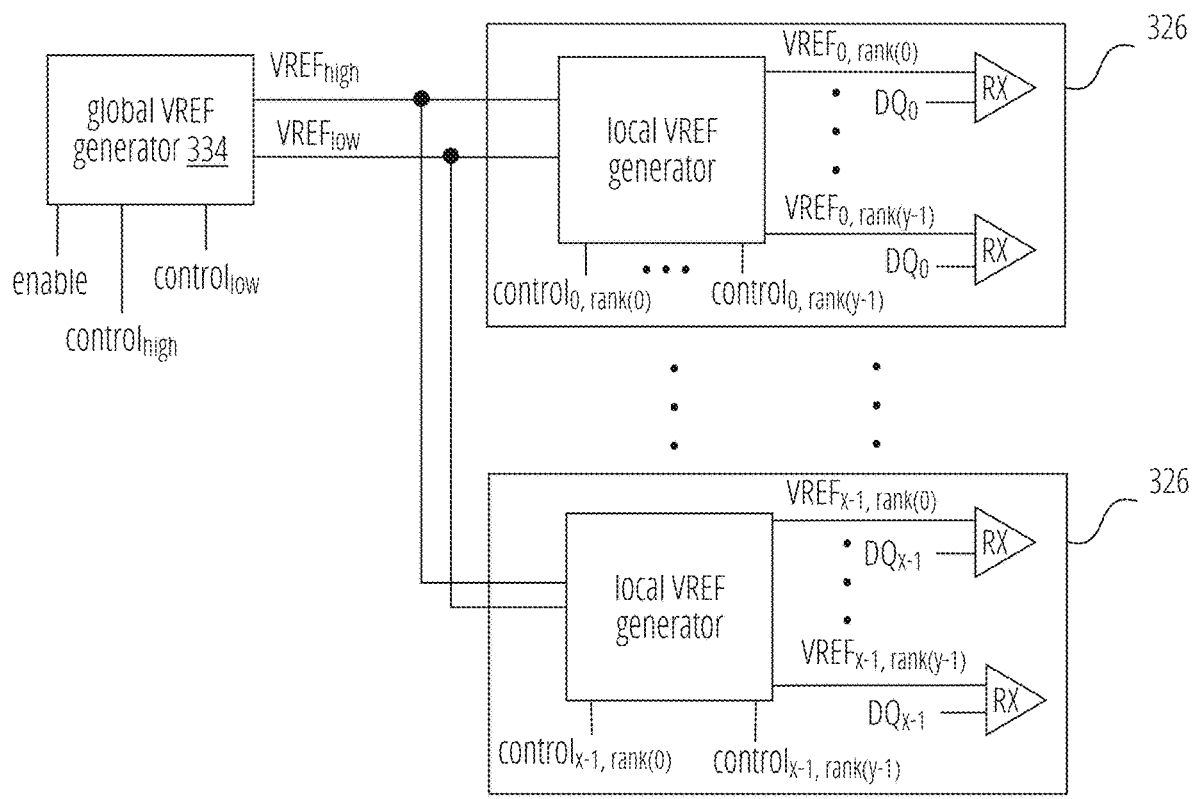
FIG. 3D depicts an embodiment of a multi-rank system utilizing a combination of a global reference voltage generator and a plurality of local reference voltage generators.

An embodiment of reference voltage generation for multiple pins of multiple ranks of IO devices is depicted in FIG. 3D. A global reference voltage generator 334 generates $VREF_{high}$ and $VREF_{low}$ to a number x of rank reference voltage generators 326 (for example as depicted in FIG. 3C), where x is the number of pins per rank.

Thus in one aspect, a circuit includes a global reference voltage generator that generates a differential voltage output and a first N-bit control input, achieving $2^n$ steps of resolution in the differential voltage. One or more local reference voltage generator is coupled to receive the differential output of the global reference voltage generator. Additional resolution over the resolution of the differential voltage is achieved at the local reference voltage generator by dividing the differential voltage into $2^m$ available steps.

Figure 4A:
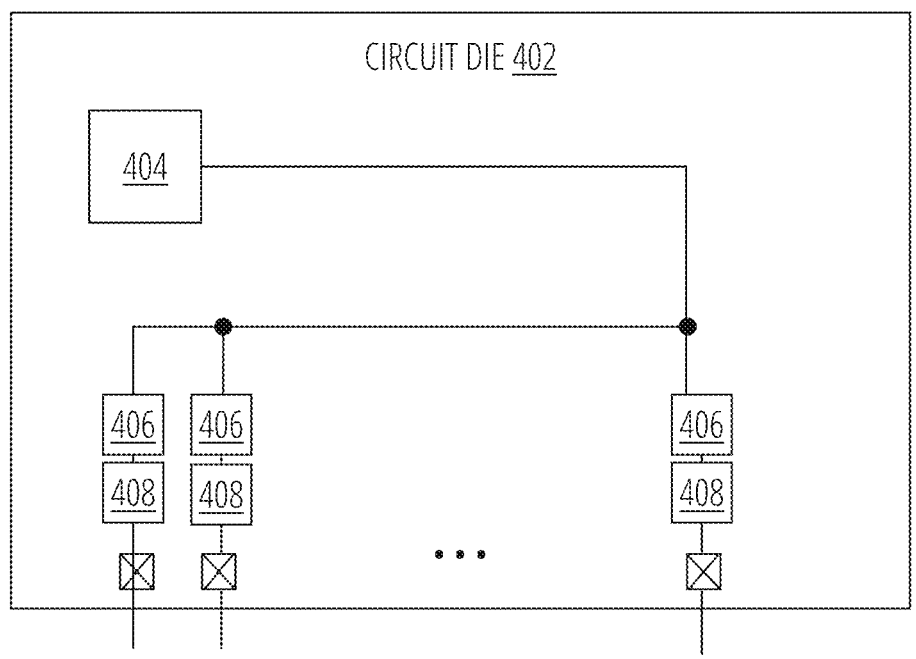
FIG. 4A depicts a circuit layout in one embodiment.

FIG. 4A depicts a circuit layout in one embodiment. A circuit die 402 comprises a global reference voltage generator 404 placed in a non-critical (e.g., non-congested) area of the circuit die 402, and local reference voltage generators 406 for IO devices 408 are placed near to one another in more critical areas near the pins or pads. $VREF_{high}$ and $VREF_{low}$ are routed across the circuit die 402 to the local reference voltage generators 406, but the analog signals for and by the local reference voltage generators 406 are run over only short, local routes (internal to the local reference voltage generators 406 and between the local reference voltage generators 406 and the IO devices 408). Layout and routing may thus be simplified over conventional approaches. Also, because each of the m-bit controlled local reference voltage generators 406 consumes less area than an n-bit controlled reference voltage generator such as the global reference voltage generator 404, area savings may be achieved as well.

Figure 4B:
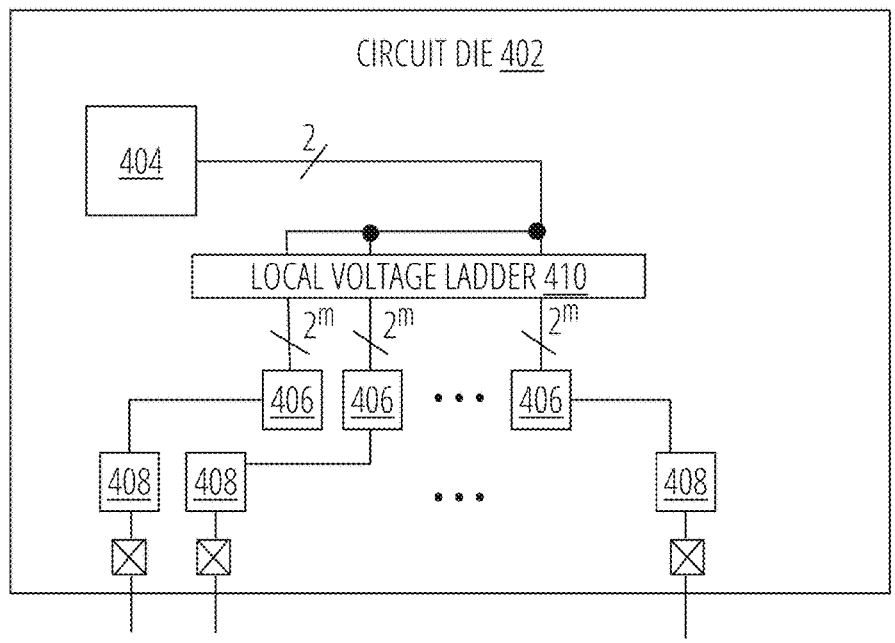
FIG. 4B depicts a circuit layout in another embodiment.

FIG. 4B depicts a circuit layout in another embodiment. Like the embodiment in FIG. 4A, the circuit die 402 comprises a global reference voltage generator 404 placed in a non-critical (e.g., non-congested) area of the circuit die 402, and local reference voltage generators 406 for IO devices 408 are placed near to one another in more critical areas near the pins or pads. $VREF_{high}$ and $VREF_{low}$ are routed across the circuit die 402 to the local reference voltage generators 406, but the analog signals for and by the local reference voltage generators 406 are run over only short, local routes (internal to the local reference voltage generators 406 and between the local reference voltage generators 406 and the IO devices 408). The benefits of the layout and placement in FIG. 4A may thus be achieved, with additional area savings as well due to the sharing of the local voltage ladder 410 by the local reference voltage generators 406. Each of the local reference voltage generators 406 may be simplified down to a single multiplexer in this embodiment.

Figure 4C:
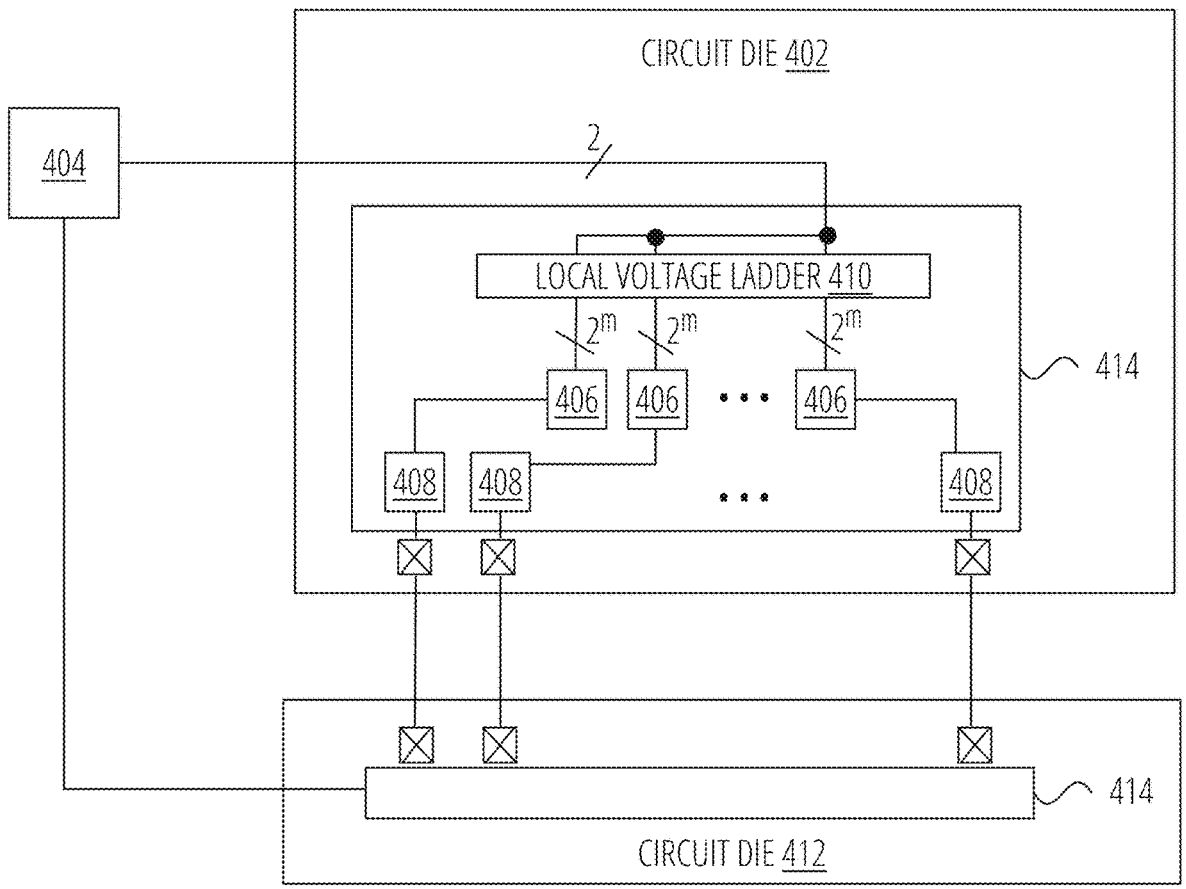
FIG. 4C depicts a circuit layout in yet another embodiment.

FIG. 4C depicts a circuit layout in yet another embodiment in which the global reference voltage generator 404 is shared among the circuit die 402 and at least one other circuit die 412, achieving additional area savings and possibly further simplifying routing and layout on the individual circuit die. Each die includes IO circuitry 414 wherein IO devices 408 are co-located on the die with local reference voltage generators 406.

Figure 5:
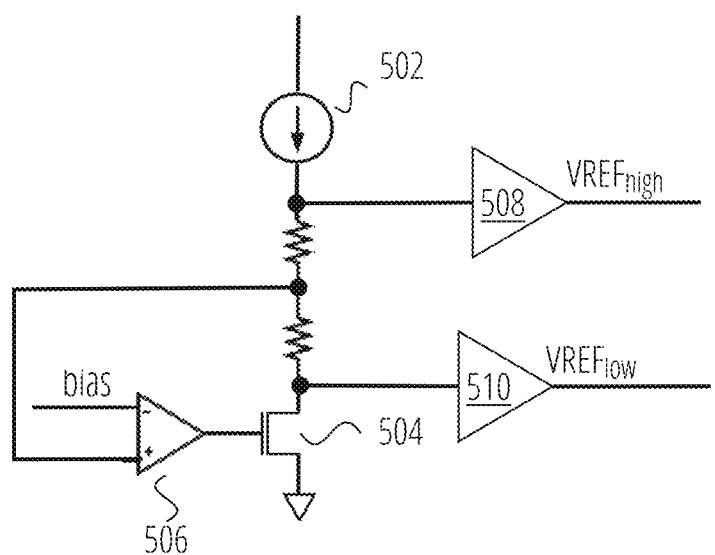
FIG. 5 depicts a global reference voltage generator in another embodiment.
Figure 6:
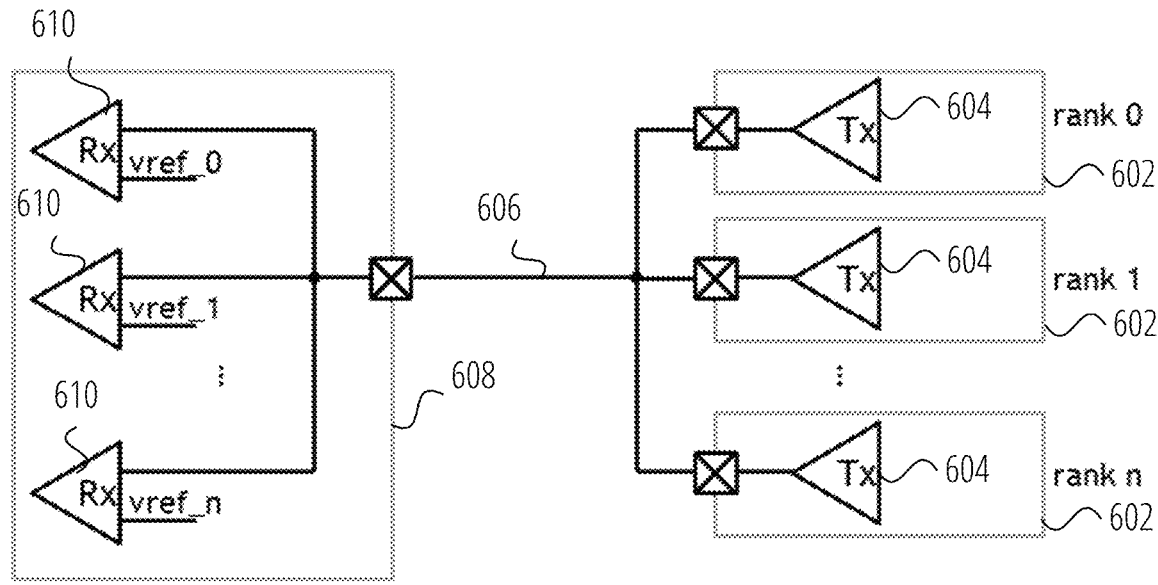
FIG. 6 depicts a multi-rank circuit system utilizing the conventional approach.

FIG. 5 depicts a global reference voltage generator in another embodiment. The global reference voltage generator comprises a current source 502 driving current to a resistive voltage divider and a transistor 504 biased via a comparator 506. Two unity gain buffers 508, 510 provide high impedance outputs for $\text{VREF}_{high}$ and $\text{VREF}_{low}$.

Figure 7:
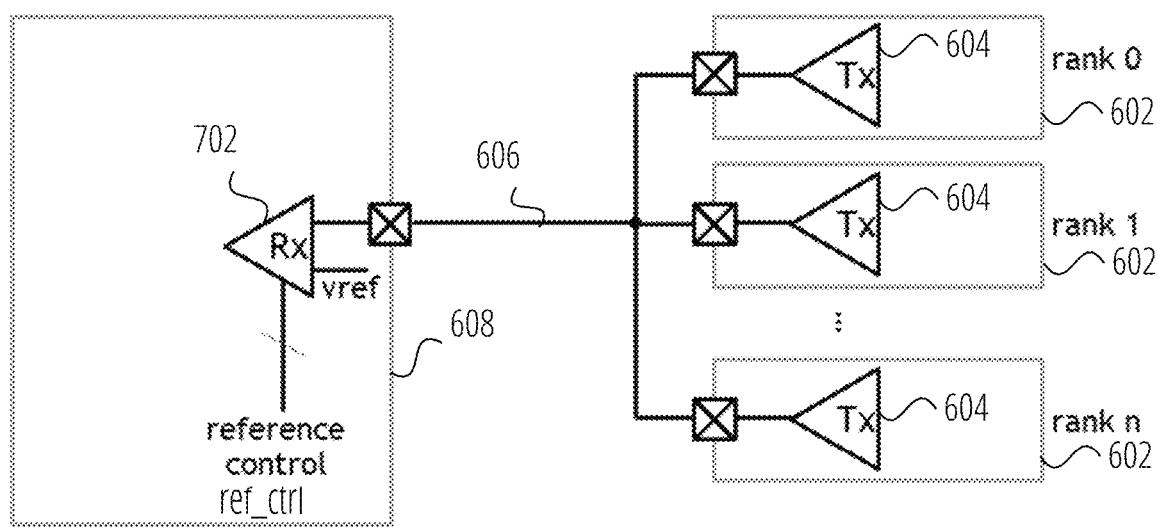
FIG. 7 depicts a multi-rank circuit system in one embodiment.

FIG. 7 depicts a multi-rank circuit system in one embodiment. The plurality of ranks 602 each include a transmitter 604 and these are ganged onto the shared IO channel 606 to the PHY circuit 608. A unified tunable differential receiver 702 terminates the IO channel 606 in the PHY circuit 608. The tunable differential receiver 702 inputs a reference voltage, and a reference voltage control that may be trained to vary according to the PVT variations among the transmitters 604. This enables the tunable differential receiver 702 to accurately distinguish data signals from any particular receiver 610 at high frequency communication speeds over the IO channel 606.

The multi-rank circuit system thus utilizes a plurality of transmitters 604 each switchably coupled to a first end of the shared IO channel 606 (meaning, one transmitter at a time is switched to occupy and utilize the IO channel 606 for communication with the tunable differential receiver 702 at the other end of the IO channel 606. The tunable differential receiver 702 is 'unified' in the sense of utilizing a single, preconfigured (unchanging) reference voltage vref, rather than comprising multiple separate receivers each receiving a preconfigured and (often) somewhat different reference voltage. The preconfigured reference voltage vref may be an analog signal that sets a baseline output level (e.g., output current) of the unified receiver. The reference voltage control (i.e., ref_ctrl in other figures) comprises a digital code to adjust the output level of the tunable differential receiver 702 according to (e.g., trained for) a particular one of the transmitters 604 that is switched to occupy the shared IO channel 606.

The digital code may be applied as two or more distinct digital codes. For example, different 8-bit sets of a 16-bit digital code may be applied to different sub-circuits of the tunable differential receiver 702. Likewise, different 4-bit sets from an 8-bit digital code may be applied separately in the tunable differential receiver 702. Examples of this technique are provided in later figures.

Figure 8A:
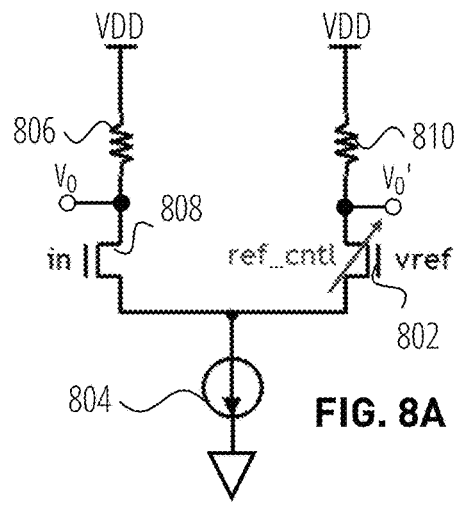
FIG. 8A depicts a general structure of a tunable differential receiver in which the current through one main branch is digitally controlled.

FIG. 8A depicts a general structure of a tunable differential receiver in which the current through one main branch is digitally controlled. A differential output signal $<v_o, v_o'>$ is generated from the main parallel circuit branches, based on an input signal IN. A first of the main parallel circuit branches comprises a first transistor that is gate-coupled to the shared IO channel, and a second of the main parallel circuit branches comprises a second transistor that is gate-coupled to the preconfigured analog reference voltage, the second transistor configured with a strength controlled by the digital code. "Strength" refers to the effective conductivity of the controlled transistor 802, which in practice may be implemented by multiple transistors according to different embodiments. Thus it should be understood throughout this disclosure and claims that the strength of "a transistor" may refer to the effective conductivity of a multi-transistor structure.

The tunable differential receiver comprises parallel branches each making a contribution to the current sink 804. The amount of current through each main branch determines the levels of the voltages $<v_o, v_o'>$ and thus together determine both the magnitude and range of the output differential voltage. One branch comprises a resistor 806 and an input transistor 808 that receives a signal from the IO channel 606. The other branch comprises a resistor 810 and a controlled transistor 802 with a gate biased by a (held constant) analog reference voltage (vref). The contribution of this branch to the current sink 804 is controlled by the ref_cntl digital code applied to the controlled transistor 802. The ref_cntl digital code varies according to a trained amount specific to the rank driving the IO channel 606 at a particular point in time. Throughout the drawings, VDD refers to supply voltage, e.g., a supply voltage rail.

Figure 8B:
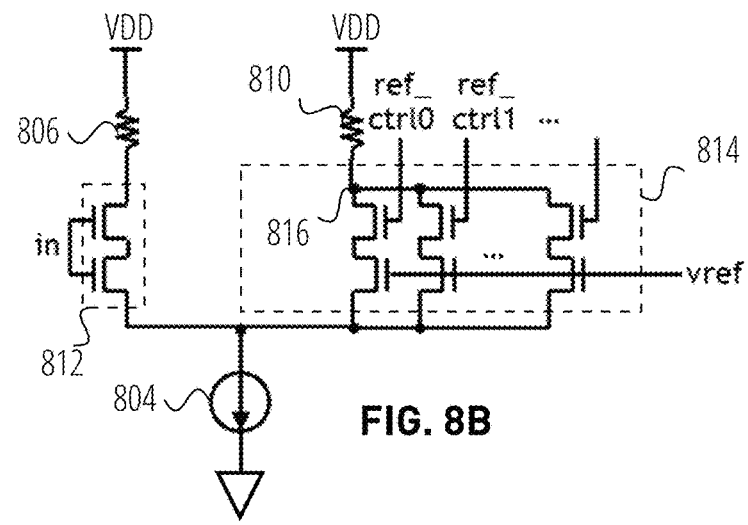
FIG. 8B depicts a tunable differential receiver in another embodiment.

FIG. 8B depicts a tunable differential receiver in one embodiment. In this embodiment a first of the main parallel circuit branches comprises one or more transistors that are gate-coupled to the shared IO channel, and a second of the main parallel circuit branches comprises a plurality of sub-branches, each sub-branch comprising a first transistor that is gate-coupled to the preconfigured analog reference voltage and a second transistor gate-coupled to receive a bit of the digital code.

The tunable differential receiver utilizes one or more input transistors 812 in one parallel branch, and a plurality of controlled current branches 814 at a common node 816 of the other parallel branch. The number of stacked input transistors 812 may match the depth of the transistor stack utilized in the controlled current branches 814 of the other main branch. The reference voltage vref provides a constant gate bias to one transistor of each controlled current branch 814, and one bit of ref_ctrl provides a bias to another transistor of each controlled current branch 814. The level of vref may be such that it only partially turns the transistors on, and in that manner provides a base level of current through the main branch and a base level to vo'. The digital code then provides small variations to $v_o'$ around the base level.

The tunable differential receiver of FIG. 8B enables digital control over the current contribution of the second parallel branch to a level of precision required in a particular implementation (number of bits in ref_ctrl). This structure provides fine-grained control of the current in the second main circuit branch, and thus provides fine-grained control over the level of $v_o'$ in the differential output.

Figure 8C:
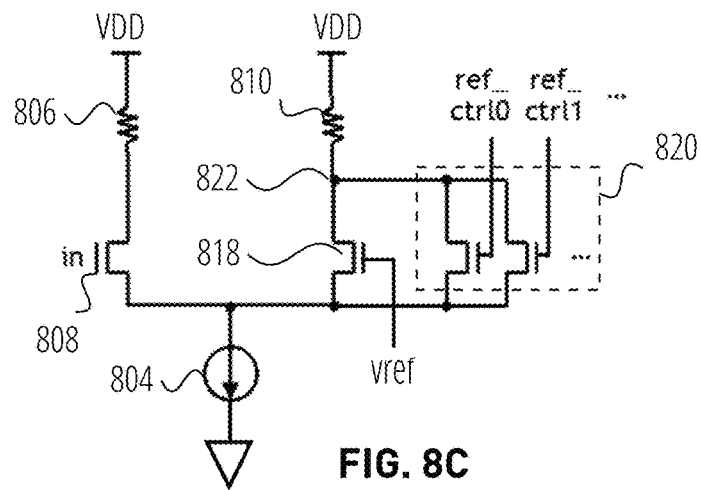
FIG. 8C depicts a tunable differential receiver in another embodiment.

FIG. 8C depicts a tunable differential receiver in another embodiment. In this embodiment a first of the main parallel circuit branches comprises one or more transistors that are gate-coupled to the shared IO channel, and a second of the main parallel circuit branches comprises a plurality of sub-branches, one of the sub-branches comprising a transistor gate-coupled to the preconfigured analog reference voltage, and each other sub-branch comprising a transistor that is gate-coupled to receive a bit of the digital code.

The tunable differential receiver comprises one parallel branch comprising resistor 806 and input transistor 808, and a second parallel branch comprising resistor 810 and transistor 818, which is gate biased by vref. Ref_ctrl is applied as a digital control with each bit controlling the contribution to the current sink 804 from one of the controlled current branches 820 that are arranged in parallel across the common node 822.

As with the tunable differential receiver of FIG. 8B, this structure provides fine-grained control of the current in the second main circuit branch, and thus provides fine-grained control over the level of $v_o'$ in the differential output. It utilizes fewer transistors than the embodiment of FIG. 8A at the cost of some precision of control.

Figure 9A:
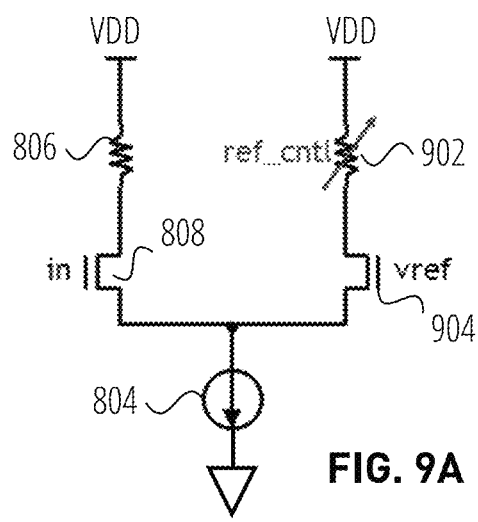
FIG. 9A depicts a tunable differential receiver in another embodiment.

FIG. 9A depicts a tunable differential receiver in another embodiment. In this embodiment a first of the main parallel circuit branches comprises a first transistor that is gate-coupled to the shared IO channel, a second of the main parallel circuit branches comprises a second transistor that is gate-coupled to the preconfigured analog reference voltage, and the second of the main parallel circuit branches comprises a variable impedance controlled by the digital code.

The tunable differential receiver comprises a structure similar to that of the tunable differential receiver depicted in FIG. 8A—one parallel branch comprising resistor 806 and input transistor 808, and a second parallel branch comprising digitally controlled impedance 902 and transistor 904, which is gate biased by vref. However instead of applying ref_ctrl to transistor 904, ref_ctrl is applied to digitally controlled impedance 902 as an impedance adjustment controlling the contribution to the current sink 804 from one of the parallel branches. The digitally controlled impedance 902 may be implemented in a number of manners known in the art. This structure provides control of the current in the second main circuit branch, and thus provides control over the level of $v_o'$ in the differential output.

Figure 9B:
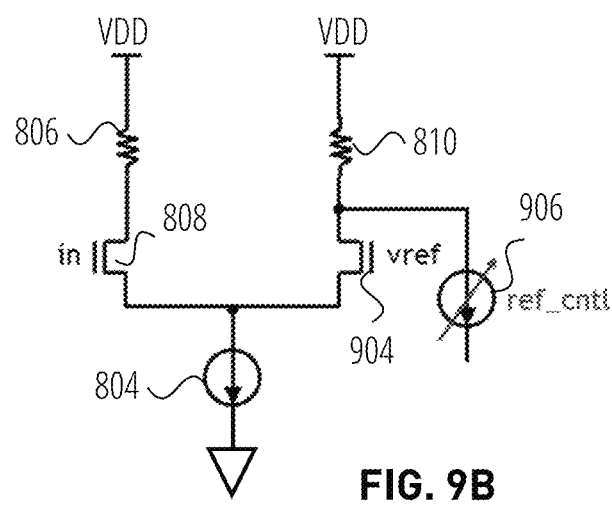
FIG. 9B depicts a tunable differential receiver in another embodiment.

FIG. 9B depicts a tunable differential receiver in another embodiment. In this embodiment a first of the main parallel circuit branches comprises a first transistor that is gate-coupled to the shared IO channel. A second of the main parallel circuit branches comprises a second transistor that is gate-coupled to the preconfigured analog reference voltage, and the second of the parallel circuit branches comprises a current shunt controlled by the digital code.

The tunable differential receiver comprises one parallel branch comprising resistor 806 and input transistor 808, and a second parallel branch comprising resistor 810 and transistor 904, which is gate biased by vref. However instead of applying ref_ctrl to transistor 904 or digitally controlled impedance 902, ref_ctrl is applied as an adjustment to controlled current sink 906, adjusting the current pulled through one of the parallel branches. This structure provides control of the current in the second main circuit branch, and thus provides control over the level of $v_o'$ in the differential output.

Figure 10A:
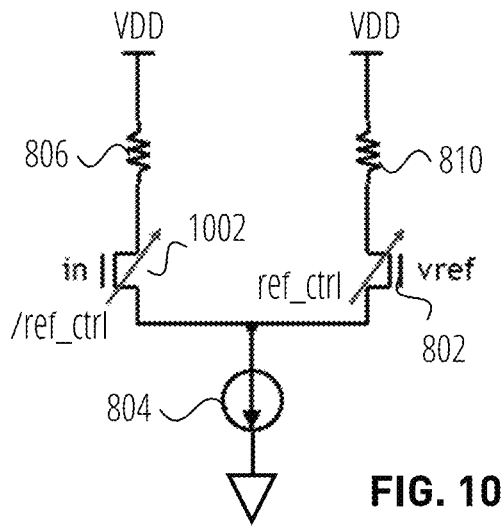
FIG. 10A depicts a general structure of a tunable differential receiver in which the current through both main branches is digitally controlled.

FIG. 10A depicts a general structure of a tunable differential receiver in which the current through both main branches is digitally controlled. In this example the digital code comprises a first digital code (/ref_ctrl) and a second digital code (ref_ctrl). A first of the main parallel circuit branches comprises a first transistor that is gate-coupled to the shared IO channel, the first transistor configured with a strength (effective conductivity) controlled by the first digital code. A second of the main parallel circuit branches comprises a second transistor that is gate-coupled to the preconfigured analog reference voltage, the second transistor configured with a strength controlled by the second digital code.

The tunable differential receiver comprises one parallel branch comprising resistor 806 and controlled input transistor 1002, and a second parallel branch comprising resistor 810 and controlled transistor 802, which is gate biased by vref. Control is applied (ref_ctrl0 and ref_ctrl1) as an adjustment to both of the controlled input transistor 1002 and the controlled transistor 802, controlling the current through each main branch. This structure provides control of the current in both of the first main branch and the second main circuit branch, and thus provides control over the level of both $v_o$ and $v_o'$ in the differential output. An exemplary embodiment of this tunable differential receiver structure is provided in FIG. 10B. More generally, any of the structures depicted in FIG. 8A-FIG. 9B for controlling the current in the second main branch may also be utilized to control the current in either the first main branch and/or the second main branch, in any combination.

Figure 10B:
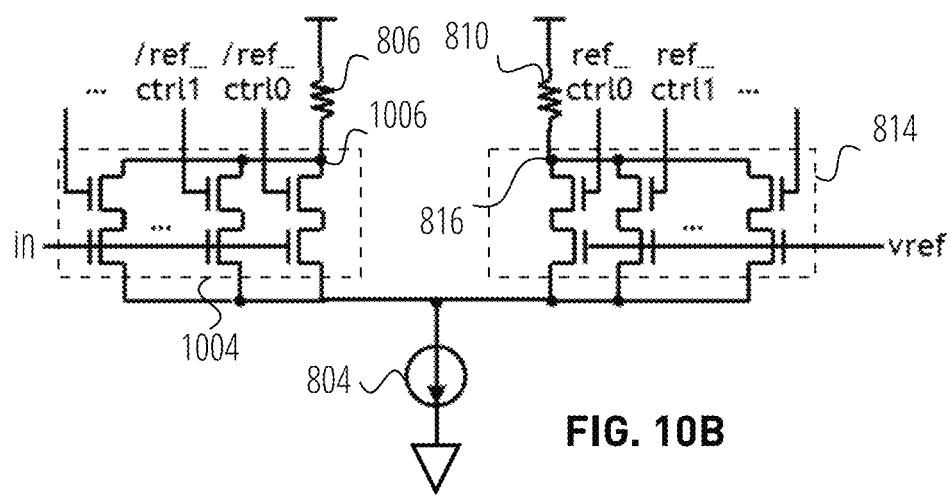
FIG. 10B depicts a tunable differential receiver in another embodiment
Figure 11:
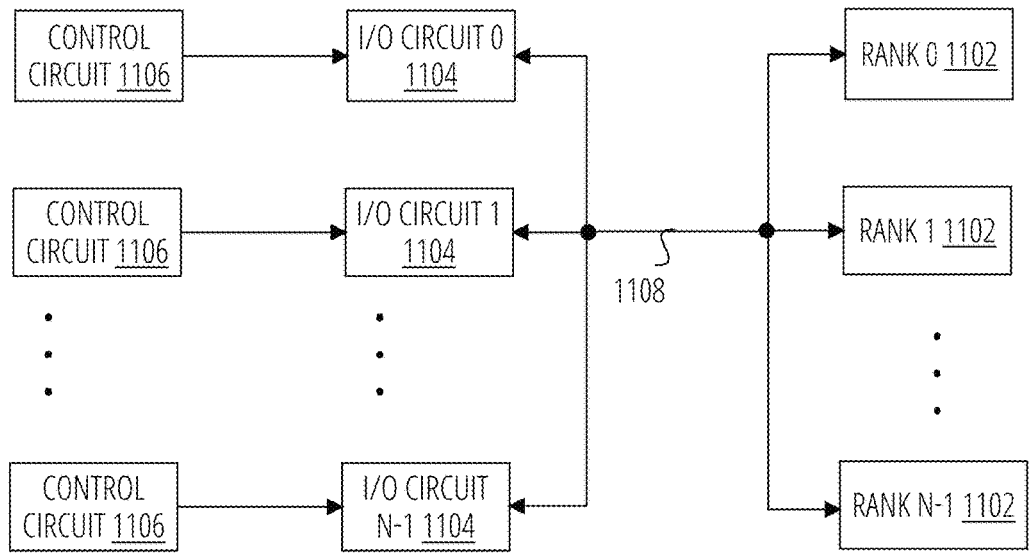
FIG. 11 depicts a conventional multi-rank circuit system.

FIG. 10B depicts a tunable differential receiver in another embodiment. In this embodiment, the digital control code to fine-tune the branch contributions to the current sink 804 comprises a first digital code (/ref_ctrl1) and a second digital code (ref_ctrl), each applied to sub-branches of different main branches of the tunable differential receiver.

In this embodiment a first of the main parallel circuit branches comprises a first plurality of sub-branches, and each of the first sub-branches comprising a first transistor gate-coupled to the shared IO channel input (IN) and a second transistor that is gate-coupled to receive a bit of the first digital code. The second of the main parallel circuit branches comprises a second plurality of sub-branches, and each of the second sub-branches comprising a first transistor gate-coupled to the preconfigured analog reference voltage and a second transistor that is gate-coupled to receive a bit of the second digital code.

Similar to the embodiment depicted in FIG. 8B, the tunable differential receiver receives the input signal (IN) from the shared IO channel at one parallel branch, and includes a plurality of controlled current branches 814 at a common node 816 of the other parallel branch. The reference voltage vref provides a constant gate bias to one transistor of each controlled current branch 814, and one bit of ref_ctrl provides a bias to another transistor of each controlled current branch 814.

The IN signal provides a gate bias to one transistor of each controlled current branch 1004 in the other main parallel branch of the tunable differential receiver, and one bit of /ref_ctrl (which may be the same signal as ref_ctrl for the other branch, or a different binary code) provides a bias to another transistor of each controlled current branch 1004.

Figure 12:
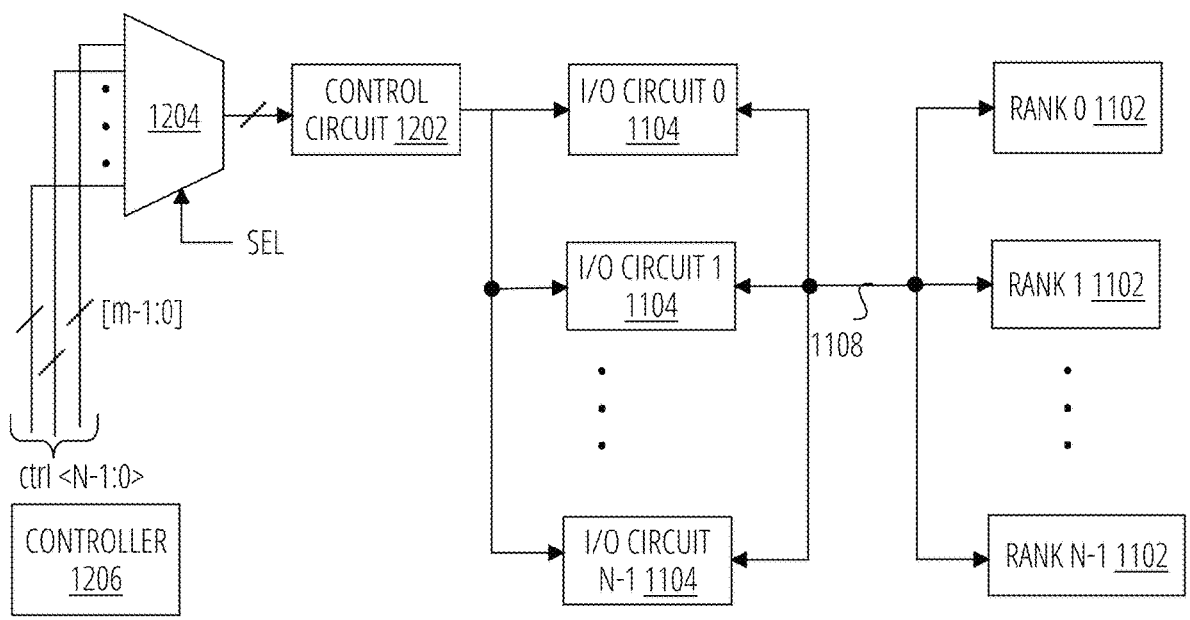
FIG. 12 depicts a multi-rank circuit system in one embodiment, in which a single control circuit 1202 is utilized with all of the multiple IO circuits 1104.

FIG. 12 depicts a multi-rank circuit system in one embodiment, in which a single control circuit 1202 is utilized with all of the multiple IO circuits 1104. A selector 1204, e.g., a multiplexer, is interposed between a plurality (N—one for each rank) of M-bit control signals stored in a controller 1206, and the control circuit 1202. The selector 1204 is operated to select one of the M-bit control signals to apply to the control circuit 1202, based on which of the rank circuits 1102 is switched to operate over the shared IO channel 1108 at a given time. In other words, a control signal corresponding to a given rank circuit 1102 is switched to the control circuit 1202 along with switching the given rank circuit 1102 to operate on the shared IO channel 1108.

Figure 13:
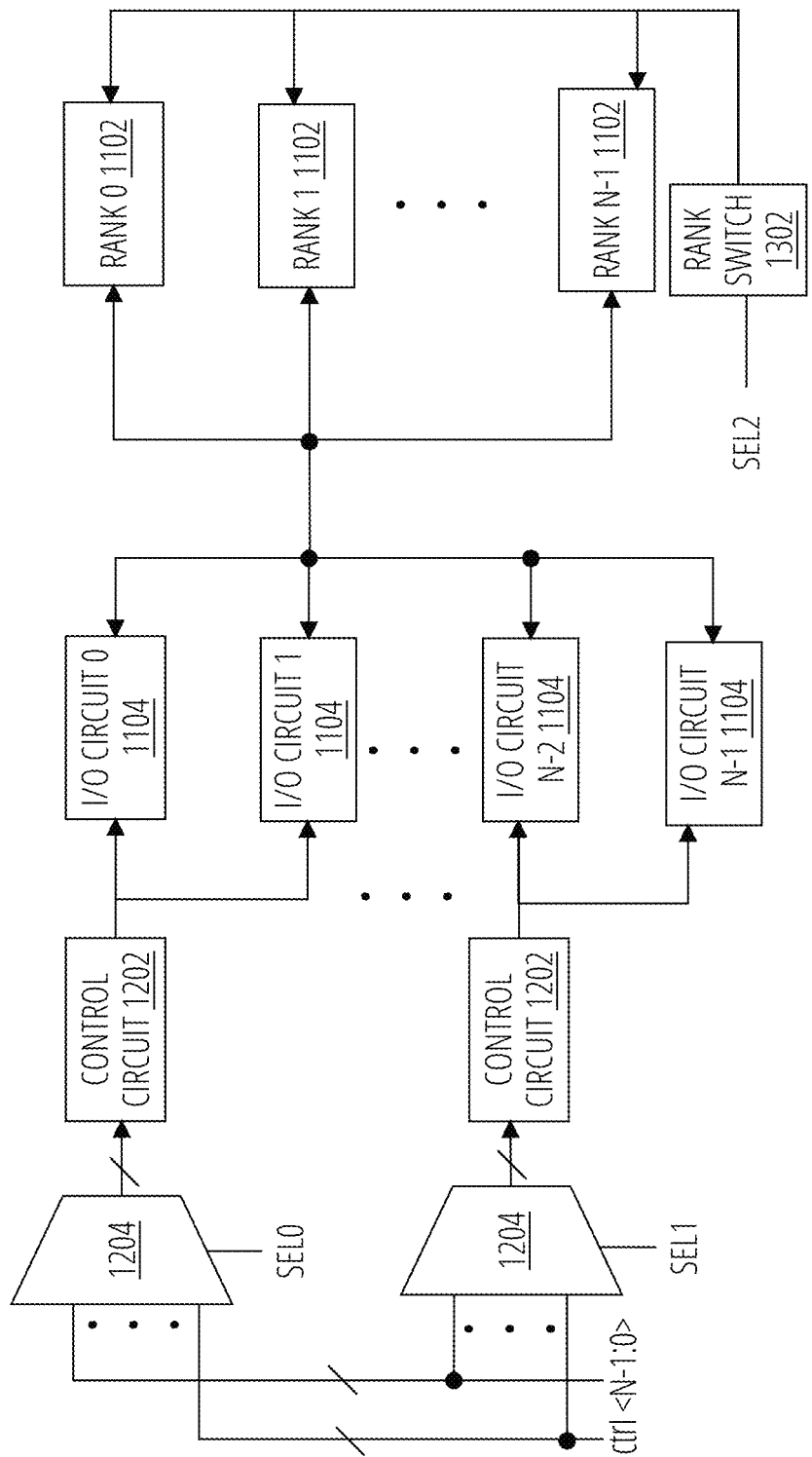
FIG. 13 depicts a multi-rank circuit system in another embodiment, in which there are multiple control circuits 1202 each dedicated to a group of (less than N) IO circuits 1104.

FIG. 13 depicts a multi-rank circuit system in another embodiment, in which there are multiple control circuits 1202 each dedicated to a group of (less than N) IO circuits 1104.

For each of the control circuits 1202, a selector 1204 is interposed between a plurality of analog control signals and the group of IO circuits 1104 to which the control circuit 1202 is dedicated. The selector 1204 corresponding to one of the IO circuit 1104 groups is operated to select one of the control signals to apply to the control circuits 1202 in the group, based on which of the rank circuits 1102 is switched via switch 1302 to operate over the shared IO channel 1108 at a given time. In other words, in this embodiment, some grouping of rank circuits 1102 may comprise sufficiently comparable characteristics that they can each operate from the same control circuit 1106. A control signal corresponding to a given rank circuit 1102 is switched to the corresponding control circuit 1202 via the corresponding selector 1204, along with switching the given rank circuit 1102 (making it the active rank) to operate on the shared IO channel 1108.

Figure 14:
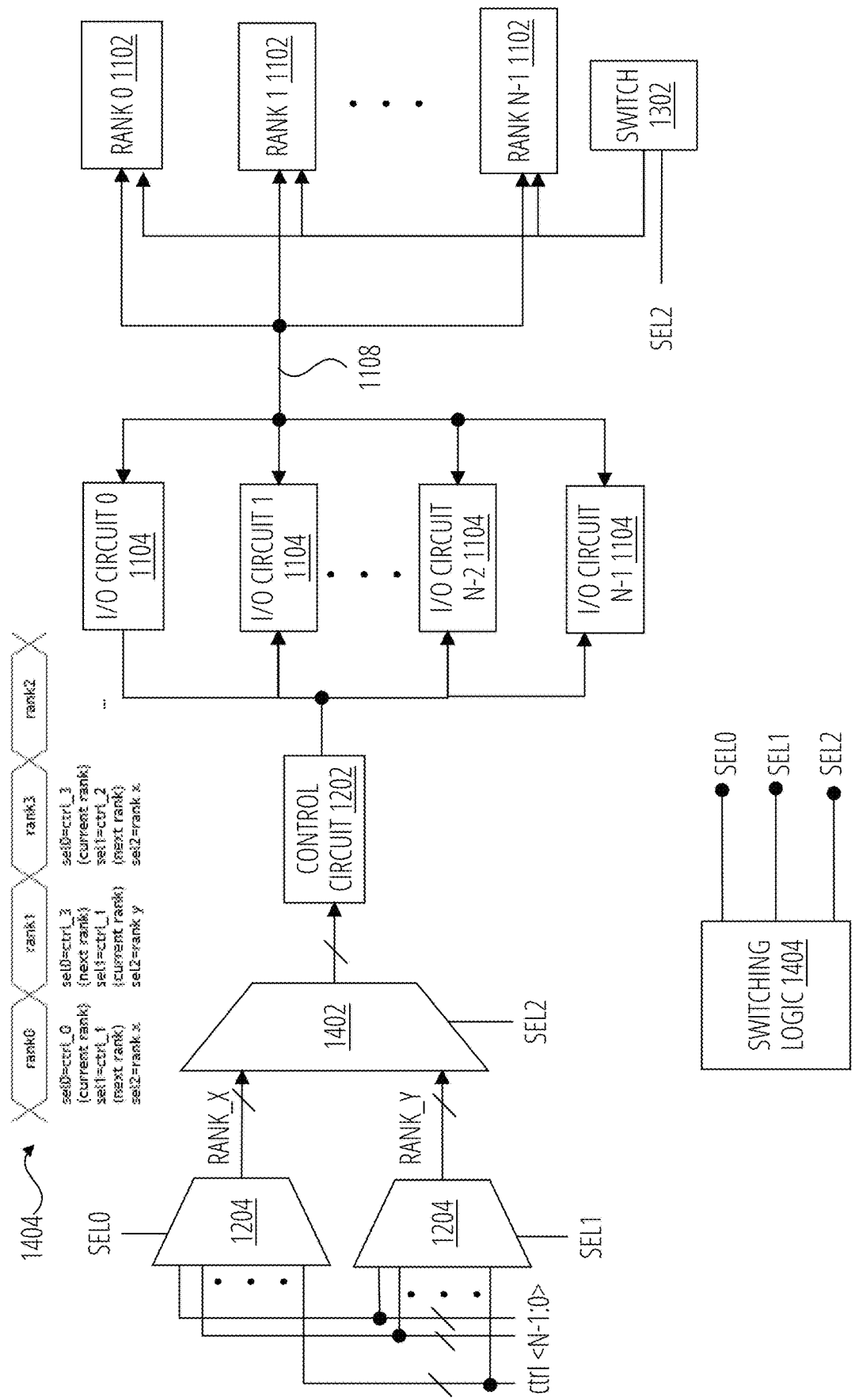
FIG. 14 depicts a multi-rank circuit system in another embodiment, in which one control circuit 1202 is utilized with all of the IO circuits 1104, and a selector 1402 is interposed between the control circuit 1202 and the selectors 1204.

FIG. 14 depicts a multi-rank circuit system in another embodiment, in which one control circuit 1202 is utilized with all of the IO circuits 1104, and a selector 1402 is interposed between the control circuit 1202 and the selectors 1204. The selector 1402 selects the output of one of the selectors 1204 to apply to the control circuit 1202, thus setting a control signal corresponding to the active rank circuit 1102. This embodiment may also be advantageous to reduce rank switching latency when the next active rank is known in advance of the currently active rank, because the control signal to apply for the next active rank may be selected to the input of the selector 1402, which is a fast-switching 2:1 multiplexer. In this embodiment, the selector 1402 switches digital values.

More generally, FIG. 14 depicts an example of a multi-rank circuit system with a first stage comprising a plurality of selectors 1204 (there may be more than two) coupled to input a plurality of digital busses, and a second stage comprising one or more selectors 1402 (there may be more than one) coupled to receive outputs of the first stage of selectors and to individually select one of the outputs of the first stage of selectors to the control circuit. Switching logic 1404 is utilized to switch one of the ranks via switch 1302 to be an active rank on the shared IO shared IO channel 1108, and to operate the first stage of selectors 1204 to select one of the digital busses to the second stage of selectors 1402 in advance of switching a next active rank to the shared IO channel 1108. The exemplary switching logic 1404 may be readily extended to "look ahead" by more than a single rank.

Figure 15:
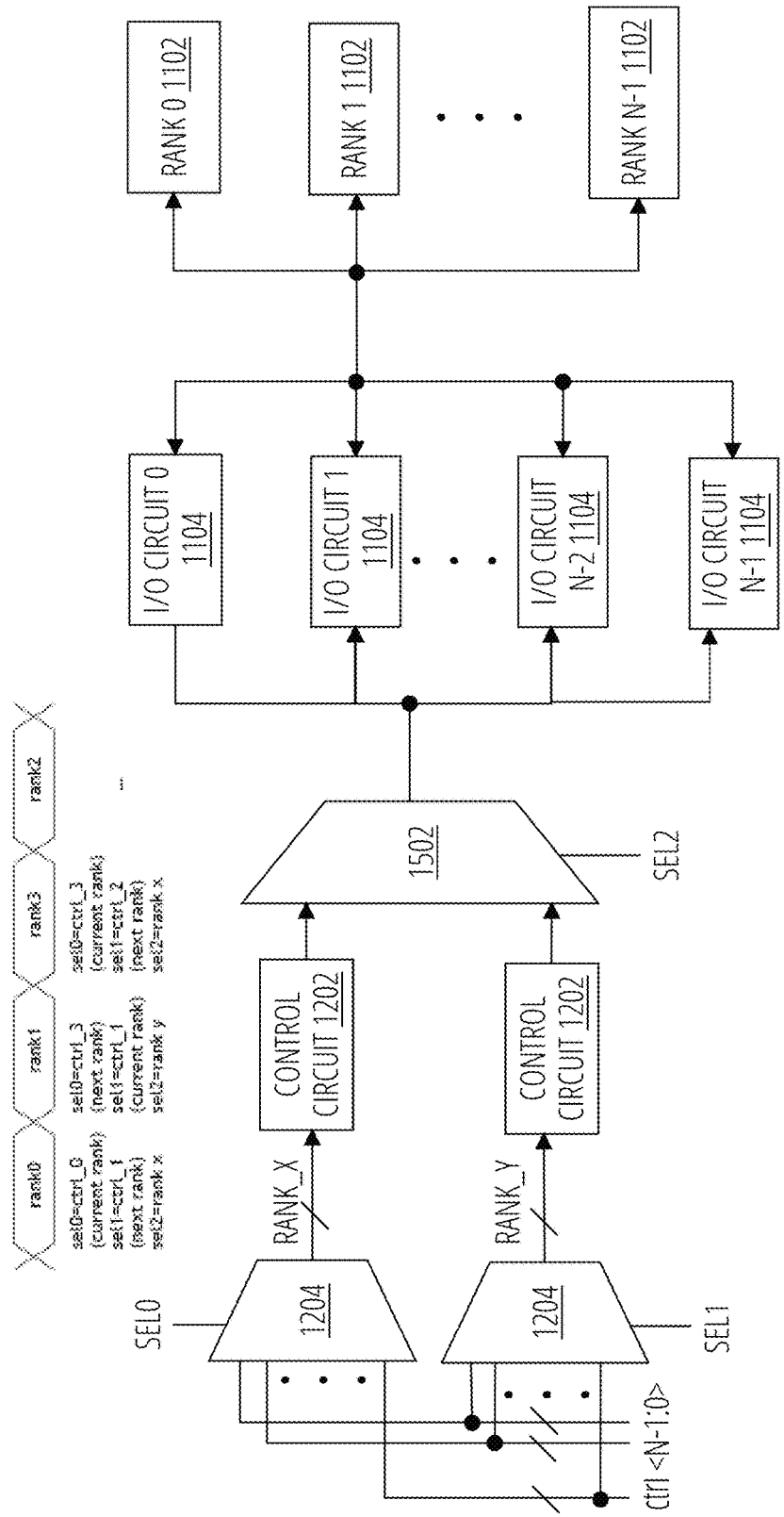
FIG. 15 depicts a multi-rank circuit system in another embodiment, in which there are multiple control circuits 1202 any of which may be applied to any of the IO circuits 1104.

FIG. 15 depicts a multi-rank circuit system in another embodiment, in which there are multiple control circuits 1202 any of which may be applied to any of the IO circuits 1104. (The switch 1302 is present but not depicted). A selector 1502 is interposed between the control circuits 1202 and the IO circuits 1104, to select the output of one of the control circuits 1202 to apply to the IO circuit 1104 corresponding to the active rank circuit 1102. This embodiment may be advantageous to reduce rank switching latency when the next active rank is known in advance of the currently active rank. The control signal to apply for the next active rank may be selected to the input of the selector 1502, which is a fast-switching 2:1 multiplexer. In this embodiment, the selector 1502 may be switching an analog signal.

The embodiments depicted in FIG. 3-FIG. 15 may be combined for greater precision of control and timing, depending on the needs of the implementation. For example, the two (or more) stages of selectors may be utilized in place of the single stage of selectors 1204 for groups of IO circuits 1104 in the embodiment of FIG. 13. Any of the embodiments may also utilize an analog selector 1502 between the control circuits 1202 and the IO circuits 1104, and so on.

Figure 16:
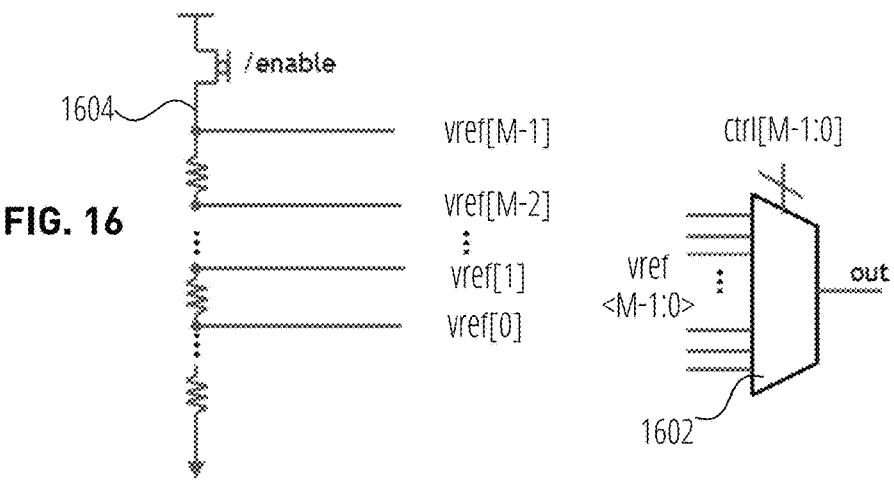
FIG. 16 depicts an embodiment of a circuit for controlling a reference voltage used by an IO circuit.

FIG. 16 depicts an embodiment of a circuit for controlling a reference voltage used by an IO circuit. The control signal (ctrl) provided to the control circuit operates the multiplexer 1602 to select, from one of the taps of the voltage ladder 1604, a reference voltage or reference voltage increment to apply to the IO circuit.

Figure 17:
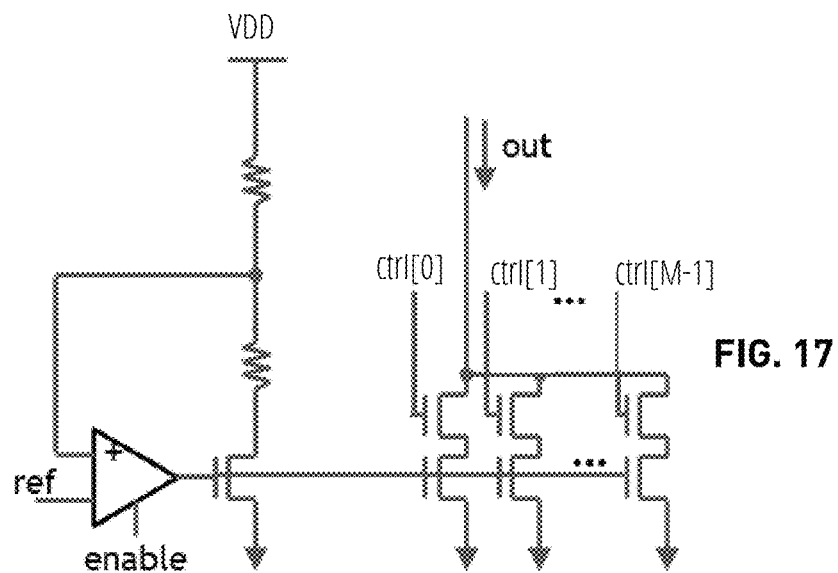
FIG. 17 depicts an embodiment of a circuit for controlling a reference current used in an IO circuit.

FIG. 17 depicts an embodiment of a circuit for controlling a reference current used in an IO circuit. The bits of the control signal (ctrl) add or subtract from the output current.

Figure 18:
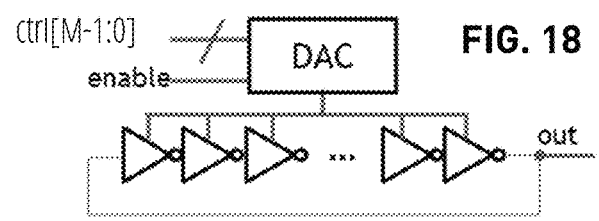
FIG. 18 depicts an embodiment of a circuit for controlling the operating frequency of an IO circuit.

FIG. 18 depicts an embodiment of a circuit for controlling the operating frequency of an IO circuit. The control signal (ctrl) adjusts the oscillation frequency of a ring oscillator circuit that clocks the IO circuit.

Figure 19:
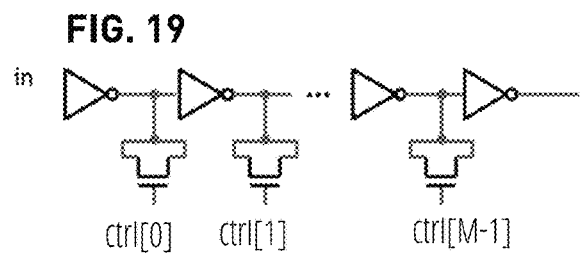
FIG. 19 depicts an embodiment of a circuit for introducing a controlled delay (e.g., for phase-shifting) in an IO circuit.
Figure 20:
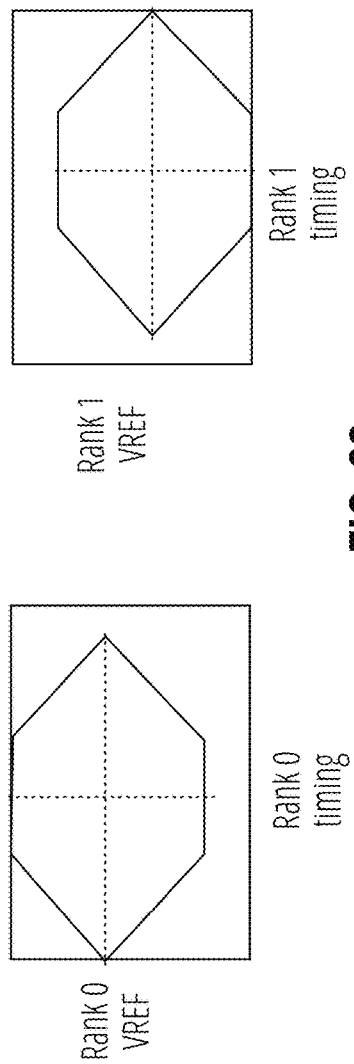
FIG. 20 depicts examples of signal eyes for a first rank (rank 0) and a second rank (rank 1) of a multi-rank circuit system.
Figure 21A:
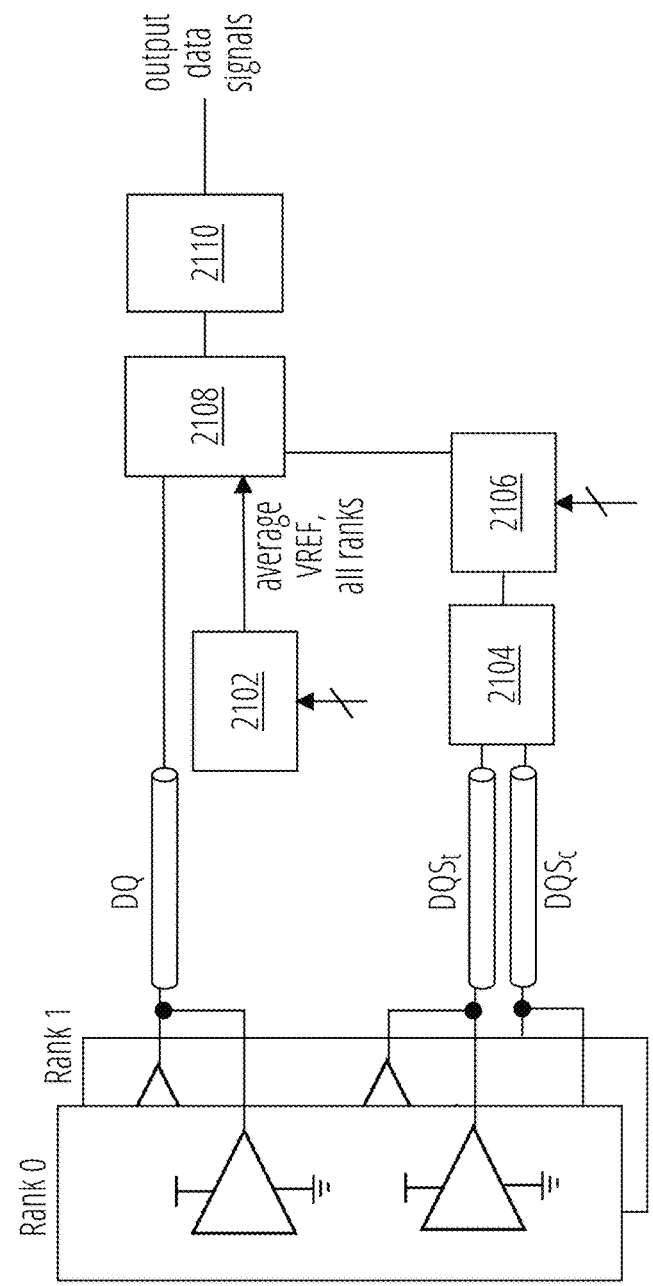
FIG. 21A depicts an example of a conventional 2-rank circuit system.
Figure 21C:
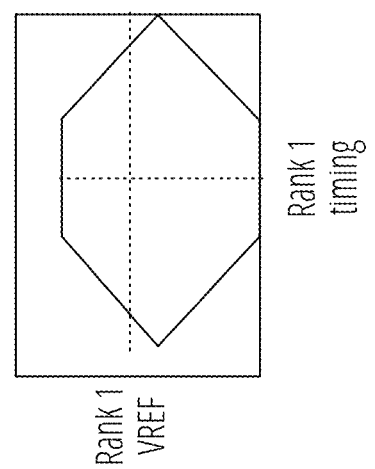
FIG. 21C depicts an example signal eye for rank 1 access utilizing an average reference voltage for all ranks.
Figure 21B:
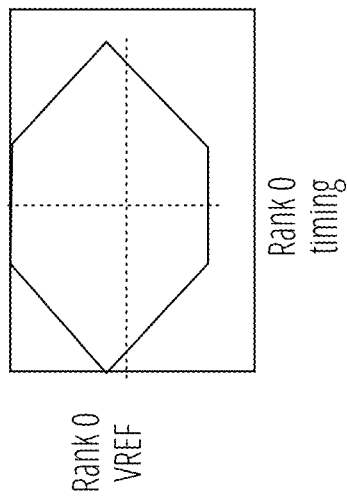
FIG. 21B depicts an example signal eye for rank 0 access utilizing an average reference voltage for all ranks.

FIG. 19 depicts an embodiment of a circuit for introducing a controlled delay (e.g., for phase-shifting) in an IO circuit. The bits of the control signal (ctrl) are utilized to introduce delay at stages of the inverter chain.

Figure 22A:
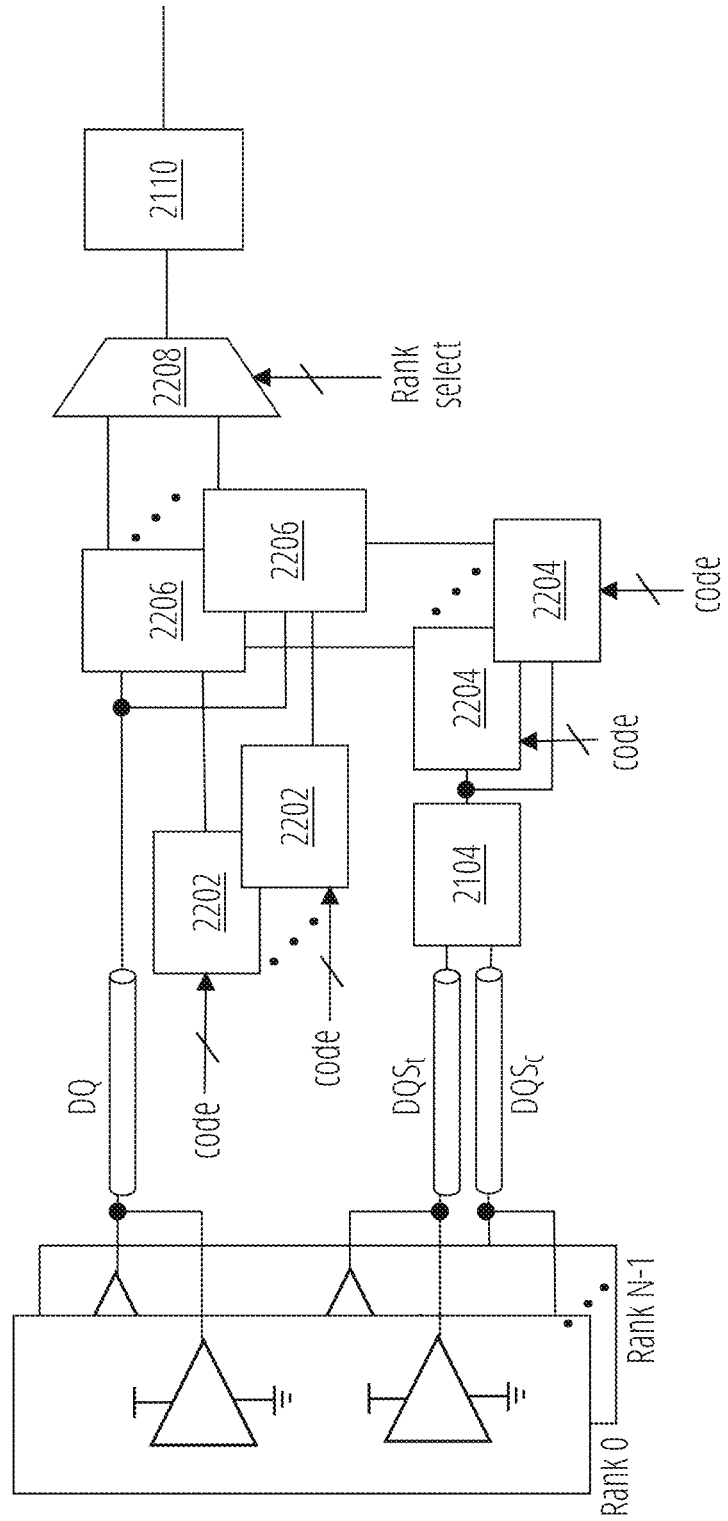
FIG. 22A depicts a multi-rank circuit in one embodiment.

FIG. 22A depicts a multi-rank circuit in one embodiment. The multi-rank system may for example be a system in which each rank comprises a dynamic random access memory (DRAM). The system comprises a plurality of data receivers 2206, each to receive data from a corresponding rank of the system, each configured with a bespoke reference voltage from a corresponding reference voltage generator 2202, and each further configured with a bespoke clock timing adjustment from a corresponding clock timing adjuster 2204. A selector 2208 chooses the output of one of the data receivers 2206 for input to the deserializer 2110. The reference voltage generated by each of the reference voltage generators 2202 is configurable with a corresponding multi-bit digital code. Likewise, the clock timing adjustment generated by each of the clock timing adjusters 2204 is configurable with a corresponding multi-bit digital code.

To reduce power consumption, data receivers 2206 and clock timing adjusters 2204 for unselected ranks may be disabled. To reduce circuit size/area, only the front end of the data receivers 2206 may be duplicated, with later stages and downstream components of the system being shared for all the ranks. By way of such an arrangement, more optimal reference voltages and clock timing for all ranks may be utilized, and faster rank-to-rank switching on the communication data line may be achieved by removing from the switching latency the limiting factors of reference voltage generator and clock timing adjustment circuit settling times.

In a more general case, a plurality of the data receivers 2206 share the reference voltage generated by one of the reference voltage generators 2202. In other words, in a general case at least one of the reference voltage generators 2202 supplies a group of two or more of the data receivers 2206.

As described elsewhere herein, area savings may be achieved by implementing each of the reference voltage generators as a selector on nodes of a common (shared) voltage ladder. One or more of the clock timing adjustment circuits maybe implemented by the exemplary digitally-configurable delay circuits described elsewhere herein.

In operation one of circuit ranks is switched (selected) to communicate over the common data line shared by the ranks. Data signals from the selected rank are applied to multiple data receivers coupled to the data line, each of the data receivers configured by one of multiple reference voltage generators and one of multiple clock timing adjustment circuits. The selection of a rank to communicate on the data line also selects an output of one of the data receivers for deserialization.

To reduce routing complexity, selection of the rank to communicate on the data line may also operate a selector interposed between the plurality of clock timing adjustment circuits and the plurality of data receivers.

Figure 22C:
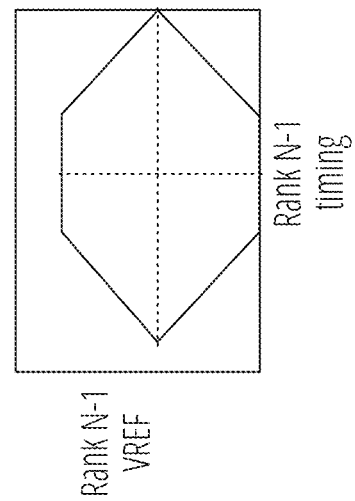
FIG. 22C depicts an example signal eye for rank 10 access utilizing a reference voltage configured specifically for rank 1.
Figure 22B:
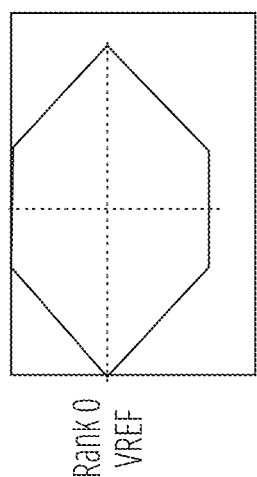
FIG. 22B depicts an example signal eye for rank 0 access utilizing a reference voltage configured specifically for rank 0.

FIG. 22B depicts an example signal eye for rank 0 access utilizing a reference voltage configured specifically for rank 0. The rank-specific reference voltage is utilized without incurring the long settling time of the reference voltage generator relative to the rank switching time. The reference voltage being specific to and more optimal for rank 0 enables the access of rank 0 in the widest portion of the signal eye.

FIG. 22C depicts an example signal eye for rank N−1 access utilizing a reference voltage configured specifically for rank N−1. The rank-specific reference voltage is utilized without incurring the long settling time of the reference voltage generator relative to the rank switching time. The reference voltage being specific to and more optimal for rank N−1 enables the access of rank N−1 in the widest portion of the signal eye.

Figure 23:
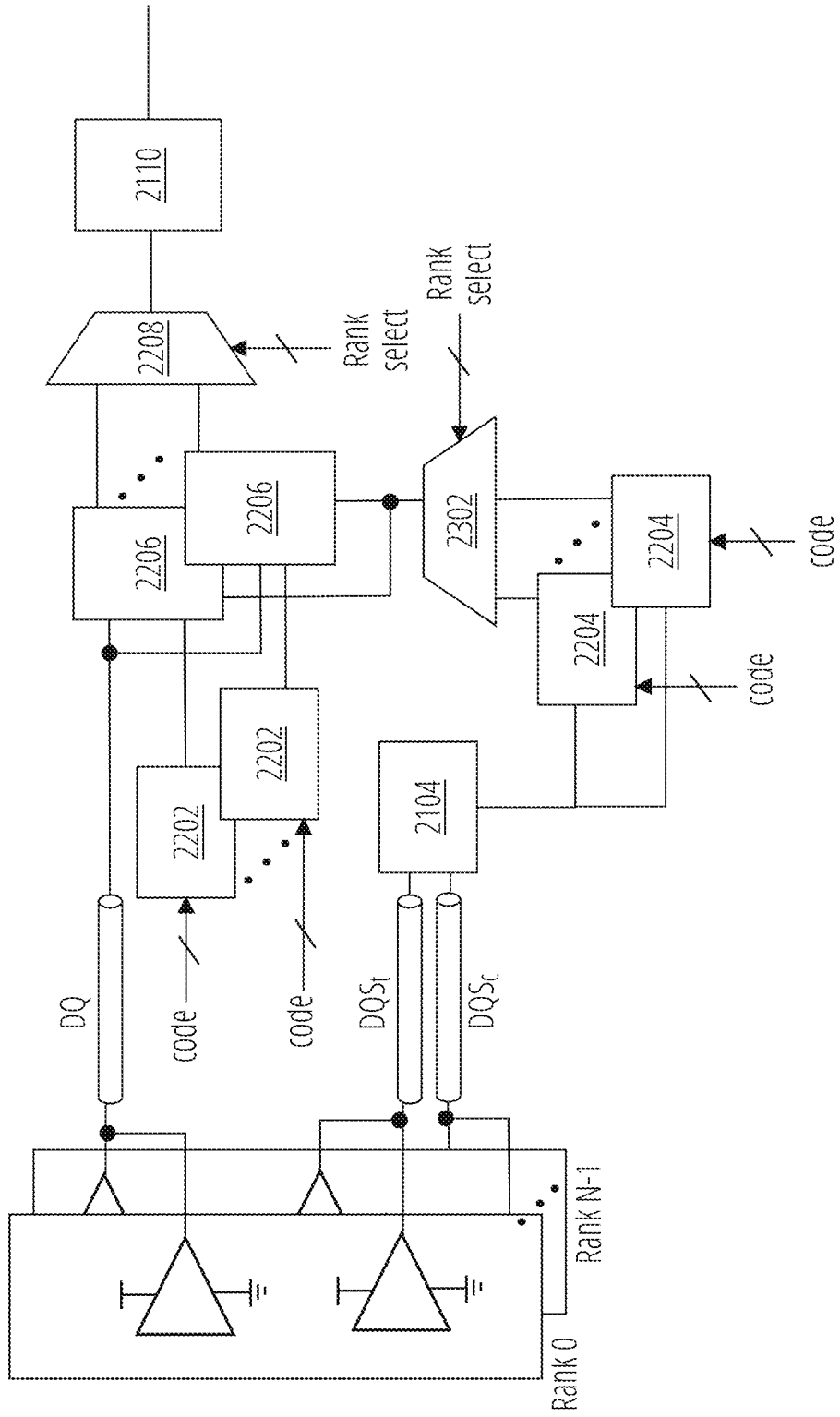
FIG. 23 depicts a multi-rank circuit in another embodiment.

FIG. 23 depicts a multi-rank circuit in another embodiment. In addition to the components introduced in conjunction with FIG. 22A, the circuit further comprises a selector 2302 to enable a reduction/simplification in the clock routing distribution from the clock timing adjusters 2204.

Figure 24:
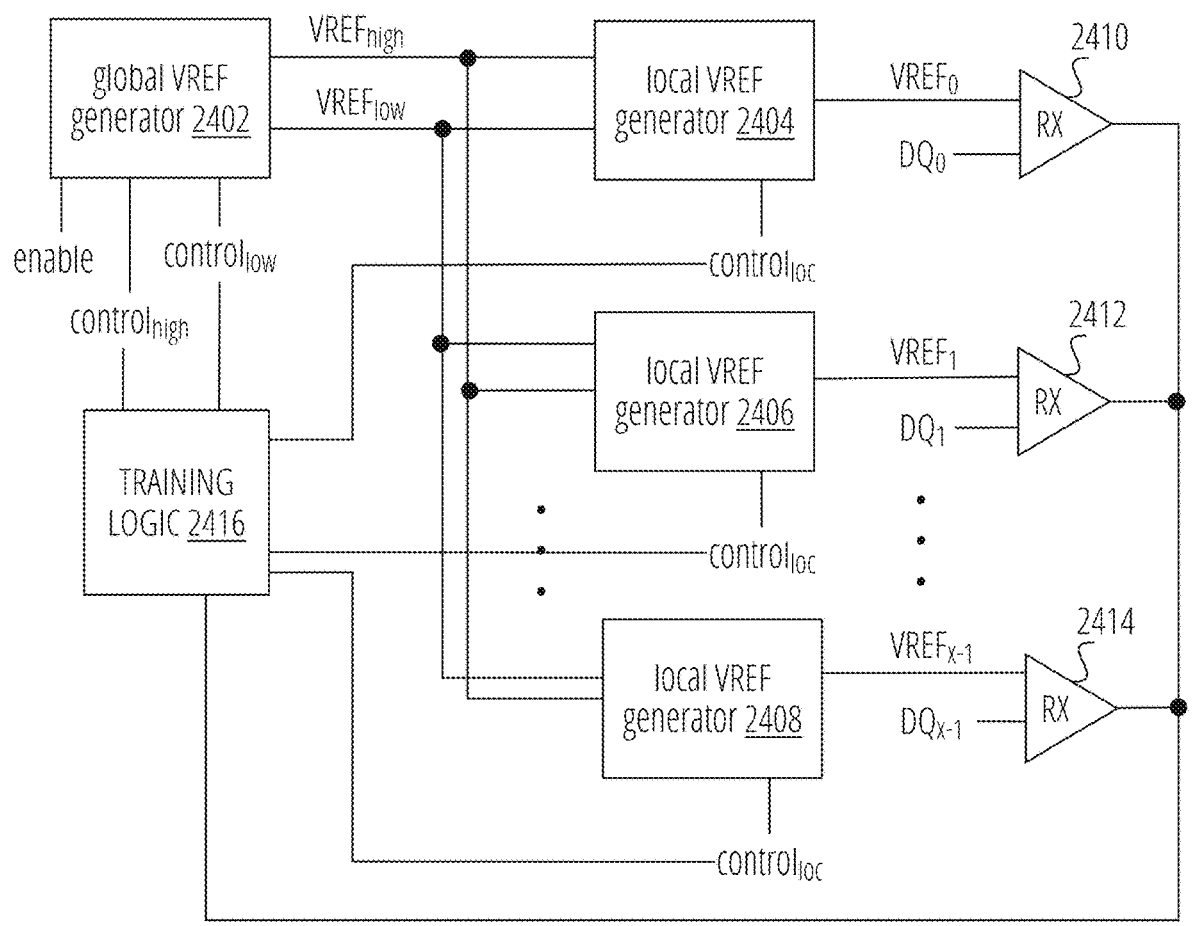
FIG. 24 depicts an embodiment of a system utilizing a combination of a global reference voltage generator and a plurality of local reference voltage generators.

FIG. 24 depicts an embodiment of a system similar to the one depicted in FIG. 3A, utilizing a combination of a global reference voltage generator 2402 and a plurality of local reference voltage generators 2404, 2406 . . . 2408 for receivers 2410, 2412, . . . 2414, respectively. As previously explained, the global reference voltage generator 2402 generates two output reference voltages, $VREF_{high}$ and $VREF_{low}$. Each of these voltages may be configured separately with n-bit control signals $control_{high}$ and $control_{low}$, respectively. Because both of $VREF_{high}$ and $VREF_{low}$ are separately configurable, the range $VREF_{high}$-$VREF_{low}$ is configurable in upper value, lower value, and extent, with a resolution of $$\frac{VREF_{max} - VREF_{min}}{2^n}.$$

An m-bit control value provided to each of the multiplexers enables individualized selection of VREF per rank, with a resolution of $$\frac{VREF_{high} - VREF_{low}}{2^m}.$$

Not only may each IO device receive an individualized and localized VREF, but the value of the local VREFs may thus be configured with higher resolution than if a global reference voltage generator alone were utilized (e.g., utilizing a narrow range for $VREF_{high}$-$VREF_{low}$ and dividing it into $2^m$ steps). The system utilizes training logic 2416 to determine $VREF_{high}$ and $VREF_{low}$ and the VREF values for the individual ranks. In view of the following description and drawings, embodiments of the training logic 2416 will be readily apparent to those of skill in the art and may be designed and implemented without undue experimentation.

Figure 25A:
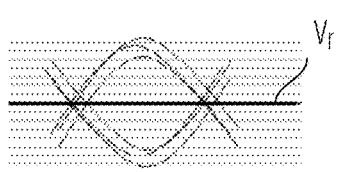
FIG. 25A and FIG. 25B depict a prior art technique for training a reference voltage generator that supplies a plurality of circuits with a single reference voltage.
Figure 25B:
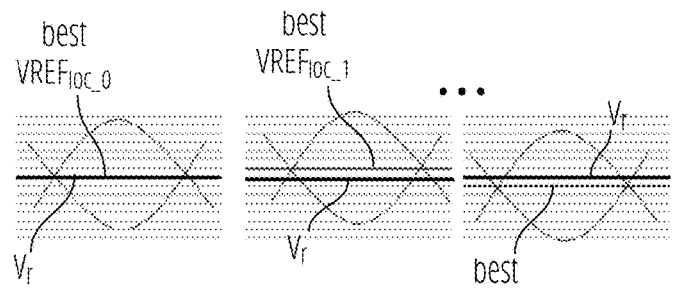

FIG. 25A and FIG. 25B depict a prior art technique for training and configuring a reference voltage generator that supplies a plurality of circuits with a single reference voltage $V_{ref}$. A reference voltage generator that supplies multiple ranks is trained based on a multi-bit input (e.g., a byte or word of bits) from the rank IO circuits. This determines a reference voltage Vr that satisfies a timing window of the multiple ranks of the circuit/system. The best reference voltages for the IO circuits (the reference voltage that maximizes timing margin) may in some cases not match $V_r$. In other words (see rank 1 and rank n in this depiction), $V_r$ is not centered in the signaling eye of every rank.

Figure 26A:
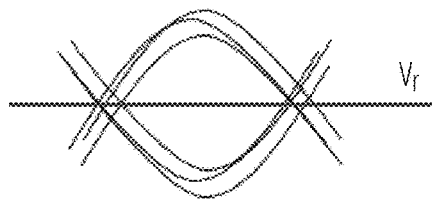
FIG. 26A-FIG. 26C depict a process for training and configuring the reference voltage generators in a multi-rank circuit.
Figure 26B:
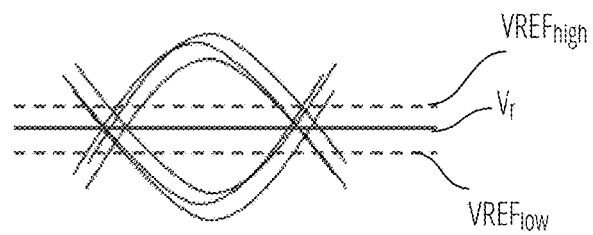
Figure 26C:
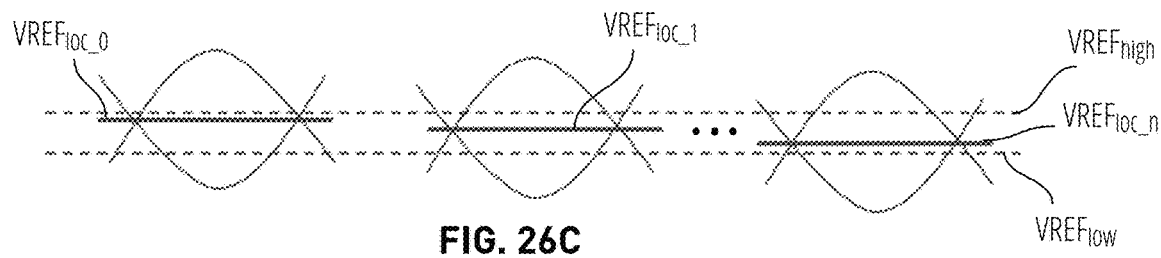

FIG. 26A-FIG. 26C depict a process for training and configuring the reference voltage generators in a multi-rank circuit. The differential voltage output of a global reference voltage generator is trained on a plurality of ranks of the multi-rank circuit, and then multiple local reference voltage generators are trained individually on the ranks within a range ($VREF_{high}$-$VREF_{low}$) of the differential voltage output. In this example, the global reference voltage generator is trained based on a multi-bit input (e.g., a byte or word of bits) from the rank IO circuits coupled to the local reference voltage generators, whereas the local reference voltage generators are each trained on a single bit from an IO circuits for one of the ranks. The global reference voltage generator provides a differential range within which the local reference voltage generators are trained to produce reference voltages centered in the signaling eye of their corresponding ranks.

To train/configure the global reference voltage generator output, a reference voltage Vr is determined that satisfies a timing window of the multiple ranks of the circuit/system. The system may determine Vr to be the voltage that can (subject to the system's resolution) maximize the timing margin of the ranks overall. Once $V_r$ is determined, the differential voltage output may be determined by applying one or more predetermined increments to $V_r$ to generate $VREF_{high}$ and $VREF_{low}$. The added increment may be the same as the subtracted increment, or the two increments may be different. In some embodiments, the increments are not predetermined (e.g., being static values stored in a memory device). Instead, the increments are determined dynamically (based on operating conditions, not static stored values) based on the lowest timing margins identified for the ranks when $V_r$ is applied as the reference voltage to the ranks. In other words, the increments are the changes to $V_r$ that would maximize the timing margin for the outlier (lowest timing margin) ranks when $V_r$ is applied as the reference voltage, as readily seen in FIG. 26A-FIG. 26C.

As described previously, the differential voltage output of the global reference voltage generator may be configured by a first N>2 control bits to set $VREF_{high}$ and a second N>2 control bits to set $VREF_{low}$. The outputs of (one or more) of the local reference voltage generators within the range $VREF_{high}$ and $VREF_{low}$ may be configured by M>2 control bits. In some embodiments, M<N.

Figure 27:
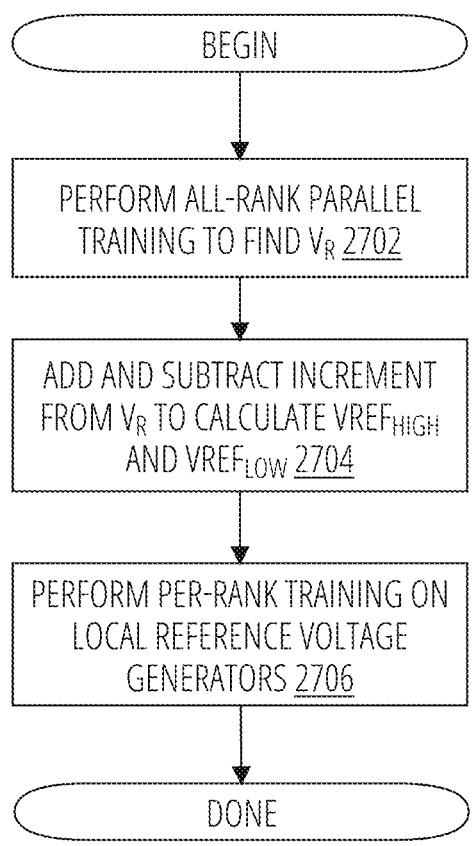
FIG. 27 depicts a process for configuring outputs of global and local reference voltage generators.

FIG. 27 depicts a process for configuring outputs of global and local reference voltage generators. All-rank training/configuration of the global reference voltage generator is performed at 2702 to find $V_r$, a voltage level that meets timing requirements that resolves (known for training purposes) bit values (e.g., a byte or sixteen-bit word, depending on the number of ranks) received from all the ranks in parallel. The value of $V_r$ will in general be less than optimal for at least some of the ranks due to process, temperature, and voltage operational variations among the ranks. At 2704 values for $VREF_{high}$ and $VREF_{low}$ are calculated from $V_r$ for example by adding and subtracting an increment ε from $V_r$ to calculate $VREF_{high}$ and $VREF_{low}$: $VREF_{high}=V_r+ε$, $VREF_{low}=V_r-ε$. At 2706 $VREF_{high}$ and $VREF_{low}$ are applied to the local reference voltage generators and per-rank training is performed on each one to configure an optimal per-rank reference voltage. As previously noted, the value of C can be static, dynamic, the same, or different for computing $VREF_{high}$ and $VREF_{low}$.

Figure 28:
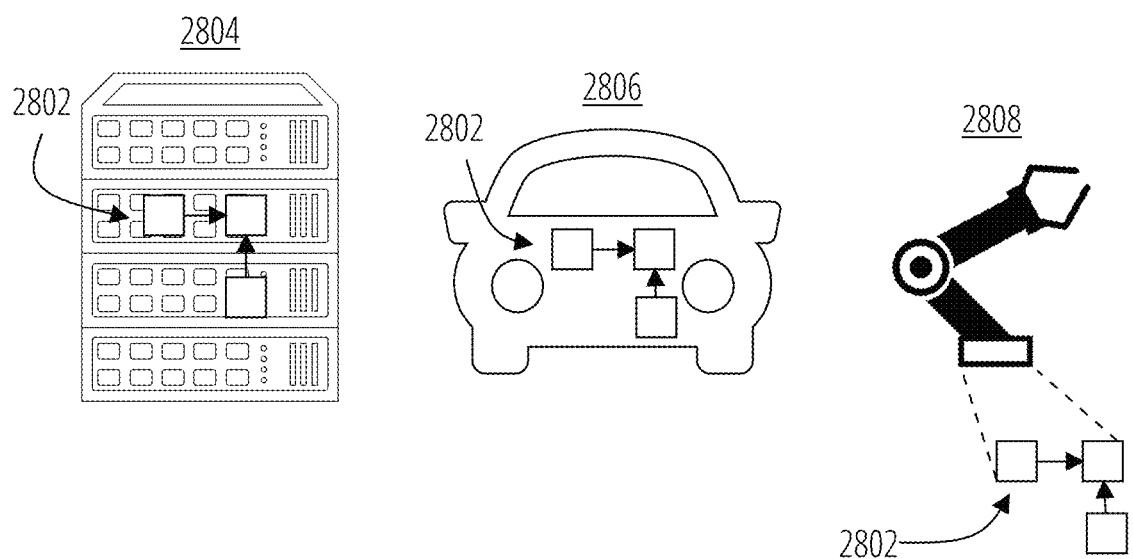
FIG. 28 depicts a multi-rank circuit 2802 in accordance with one embodiment.

FIG. 28 depicts exemplary scenarios for use of a multi-rank circuit 2802 implementing embodiments of the disclosed mechanisms. A multi-rank circuit 2802 may be utilized in a computing system 2804, a vehicle 2806, and a robot 2808, to name just a few examples. The multi-rank circuit 2802 may be utilized in a multi-rank machine memory system, for example.

LISTING OF DRAWING ELEMENTS 102 global reference voltage generator
104 receiver
106 receiver
108 receiver
110 multiplexer
112 voltage ladder
114 unity gain buffer 116 local reference voltage generator
118 local reference voltage generator
120 local reference voltage generator
122 local reference voltage generator
124 local reference voltage generator
126 local reference voltage generator
202 DRAM
204 DRAM
206 receiver
208 receiver
210 receiver
212 receiver
214 physical communication layer circuit
302 global reference voltage generator
304 local reference voltage generator
306 local reference voltage generator
308 local reference voltage generator
310 receiver
312 receiver
314 receiver
316 voltage ladder
318 multiplexer
320 multiplexer
322 unity gain buffer
324 unity gain buffer
326 rank reference voltage generator
328 voltage ladder
330 multiplexer
332 multiplexer
334 global reference voltage generator
402 circuit die
404 global reference voltage generator
406 local reference voltage generator
408 IO device
410 local voltage ladder
412 circuit die
414 IO circuitry
502 current source
504 transistor
506 comparator
508 unity gain buffer
510 unity gain buffer
602 rank
604 transmitter
606 IO channel
608 PHY circuit
610 receiver
702 tunable differential receiver
802 controlled transistor
804 current sink
806 resistor
808 input transistor
810 resistor
812 input transistor
814 controlled current branch
816 common node
818 transistor
820 controlled current branch
822 common node
902 digitally controlled impedance
904 transistor
906 controlled current sink
1002 controlled input transistor
1004 controlled current branch
1006 common node
1102 rank circuit
1104 IO circuit
1106 control circuit
1108 shared IO channel
1202 control circuit
1204 selector
1206 controller
1302 switch
1402 selector
1404 switching logic
1502 selector
1602 multiplexer
1604 voltage ladder
2102 reference voltage generator
2104 clock receiver
2106 clock timing adjuster
2108 data receiver
2110 deserializer
2202 reference voltage generator
2204 clock timing adjuster
2206 data receiver
2208 selector
2302 selector
2402 global reference voltage generator
2404 local reference voltage generator
2406 local reference voltage generator
2408 local reference voltage generator
2410 receiver
2412 receiver
2414 receiver
2416 training logic
2702 perform all-rank parallel training to find $V_r$
2704 calculate $VREF_{high}$ and $VREF_{low}$ from $V_r$
2706 perform per-rank training on local reference voltage generators
2802 multi-rank circuit
2804 computing system
2806 vehicle
2808 robot Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Mention of "optimum" or "maximum" values should be understood to refer to values achievable within the practical resolution of a particular implementation, and not to refer to theoretical optimal or maximal values.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A multi-rank circuit system comprising:
   a plurality of ranks;
   a shared input/output (IO) channel;
   a plurality of IO circuits coupled to the ranks via the shared IO channel;
   at least one control circuit for the IO circuits;
   a plurality of multi-bit digital busses;
   a first stage comprising a plurality of selectors coupled to input the digital busses;
   a second stage comprising one or more selectors coupled to receive outputs of the first stage of selectors and to individually select one of the outputs of the first stage of selectors to the control circuit; and
   logic configured to switch one of the ranks to be an active rank on the shared IO channel, and to operate the first stage of selectors to select one of the digital busses to the second stage of selectors in advance of switching a next active rank to the shared IO channel.

2. The multi-rank circuit system of claim 1, wherein the first stage consists of two selectors and the second stage consists of a single selector.

3. The multi-rank circuit system of claim 1, wherein the ranks are memory circuits.

4. The multi-rank circuit system of claim 1, further comprising:
   an analog selector interposed between the control circuits and the IO circuits.

5. The multi-rank circuit system of claim 1, wherein:
   the at least one control circuit comprises a plurality of control circuits, each control circuit coupled to control a different grouping of the IO circuits; and
   a first stage comprising a plurality of selectors is each coupled to input the digital busses and to output signals from one of the digital busses to a second stage consisting of a selector to select one of the outputs of the first stage of selectors to one of the control circuits in the corresponding grouping of the IO circuits.

6. The multi-rank circuit system of claim 5, further comprising:
an analog selector interposed between the control circuits and the IO circuits.

7. The multi-rank circuit system of claim 1, wherein the control circuit comprises a reference voltage control.

8. The multi-rank circuit system of claim 1, wherein the control circuit comprises a delay control.

9. The multi-rank circuit system of claim 1, wherein the control circuit comprises a frequency control.

10. The multi-rank circuit system of claim 1, wherein the control circuit comprises a reference current control.

11. A multi-rank machine memory system comprising:
a first stage of selectors coupled to input a plurality of multi-bit digital busses;
a second stage of one or more selectors coupled to receive outputs of the first stage of selectors and to individually select one of the outputs of the first stage of selectors to one or more IO control circuits; and
logic configured to switch the first stage of selectors to select one of the digital busses to the second stage of selectors in advance of switching ranks on the shared IO channel.

12. The memory system of claim 11, wherein the first stage consists of two selectors and the second stage consists of a single selector.

13. The memory system of claim 11, further comprising:
an analog selector interposed between the control circuits and a plurality of IO circuits.

14. The memory system of claim 11, wherein:
the one or more IO control circuit comprises a plurality of IO control circuits, each IO control circuit coupled to control a different grouping of IO circuits; and
a first stage comprising a plurality of selectors is each coupled to input the digital busses and to output signals from one of the digital busses to a second stage consisting of a selector to select one of the outputs of the first stage of selectors to one of the IO control circuits in the corresponding grouping of the IO circuits.

15. The memory system of claim 11, wherein at least one of the IO control circuits comprises a reference voltage control.

16. The multi-rank circuit system of claim 11, wherein at least one of the IO control circuits comprises a phase control.

17. The multi-rank circuit system of claim 11, wherein at least one of the IO control circuits comprises a frequency control.

18. The multi-rank circuit system of claim 11, wherein at least one of the IO control circuits comprises a reference current control.

19. A multi-rank machine memory system comprising a plurality of memory ranks ganged on a shared IO channel, and further comprising:
a pair of selectors each coupled to input a plurality of multi-bit digital codes on separate busses;
a single 2:1 selector coupled to receive both of the digital codes output by the pair of selectors;
switching logic to select one of the digital codes output by the pair of selectors to an input of the 2:1 selector in advance of switching the memory ranks on the shared IO channel, and to select one of the digital codes to an IO control circuit coupled to an output of the 2:1 multiplexer in conjunction with switching the memory ranks; and
wherein the digital code configures a reference voltage or a reference current for an IO circuit.

20. The multi-rank machine memory system of claim 19, wherein the digital code configures a reference voltage by selecting a tap on a voltage ladder.

21. The multi-rank machine memory system of claim 19, wherein the digital code configures a reference current by adjusting a current in a plurality of parallel circuit branches.

* * * * *